(12) United States Patent
Rodriquez et al.

(10) Patent No.: US 10,872,928 B2
(45) Date of Patent: Dec. 22, 2020

(54) METHOD OF MANUFACTURING AN ENHANCED HIGH PERFORMANCE IMAGE SENSOR DEVICE

(71) Applicant: DPIX, LLC, Colorado Springs, CO (US)

(72) Inventors: Robert Rodriquez, Colorado Springs, CO (US); Shawn Michael O'Rourke, Colorado Springs, CO (US); Ick-Hwan Ko, Colorado Springs, CO (US); Paul Carey, Mountain View, CA (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 16/549,392

(22) Filed: Aug. 23, 2019

(65) Prior Publication Data
US 2020/0075678 A1   Mar. 5, 2020

Related U.S. Application Data

(60) Provisional application No. 62/725,147, filed on Aug. 30, 2018.

(51) Int. Cl.
*H01L 27/30* (2006.01)
*H01L 51/00* (2006.01)
(Continued)

(52) U.S. Cl.
CPC ........ *H01L 27/307* (2013.01); *H01L 51/0003* (2013.01); *H01L 51/4253* (2013.01); *H01L 51/448* (2013.01)

(58) Field of Classification Search
CPC .............. H01L 27/307; H01L 51/0003; H01L 51/4253; H01L 51/448
(Continued)

(56) References Cited

U.S. PATENT DOCUMENTS 8,987,724 B2   3/2015   Benwadih
9,009,637 B2   4/2015   Premont et al.
(Continued)

OTHER PUBLICATIONS

Arredondo, B., et al., "Performance of ITO-free inverted organic bulk heterojunction photodetectors: Comparison with standard device architecture", 14, Jul. 6, 2013, pp. 2484-2490.
(Continued)

*Primary Examiner* — Tong-Ho Kim
(74) *Attorney, Agent, or Firm* — Slater Matsil, LLP

(57) ABSTRACT

An image sensor includes a substrate, a thin film transistor on the substrate, a dielectric layer over the thin film transistor, a stacked metal layer on and extending through the dielectric layer to the thin film transistor, a bulk heterojunction layer directly coupled to the stacked metal layer, either a hole transport layer directly coupled to the bulk heterojunction layer, and a top contact layer directly coupled to the hole transport layer, or a top contact layer directly coupled to the bulk heterojunction layer. The bulk heterojunction layer includes an electron donor/acceptor material, the hole transport layer includes a transparent conductive polymer material, and the top contact layer includes a transparent conductive material. The image sensor includes a moisture barrier layer directly coupled to the top contact layer, including an optically clear adhesive and a laminated transparent barrier film.

20 Claims, 29 Drawing Sheets

(51) Int. Cl.
*H01L 51/42* (2006.01)
*H01L 51/44* (2006.01)

(58) Field of Classification Search
USPC .......................................................... 257/40
See application file for complete search history.

(56) References Cited

U.S. PATENT DOCUMENTS

| | | | |
|---|---|---|---|
| 9,786,856 B2 | 10/2017 | O'Rourke et al. | |
| 9,929,215 B2 | 3/2018 | Rodriquez et al. | |
| 2016/0027827 A1* | 1/2016 | Sekine | H01L 27/14612 250/370.09 |
| 2017/0179199 A1* | 6/2017 | Rodriquez | H01L 27/307 |
| 2018/0166478 A1* | 6/2018 | Nakano | H01L 27/14663 |
| 2019/0103570 A1* | 4/2019 | Hammond | H01L 51/0021 |

OTHER PUBLICATIONS

Gelinck, Gerwin H., et al., "X-ray imager using solution processed organic transistor arrays and bulk heterojunction photodiodes on thin, flexible plastic substrate", Elsevier, Organic Electronics, 14, Jul. 17, 2013, pp. 2602-2609.

Liu, Xilan et al., "Solution-processed near-infrared polymer photodetectors with an inverted device structure", Elsevier, Organic Electronics, 3, Sep. 6, 2012, pp. 2929-2934.

Tedde, Sandro F., et al., "Fully Spray Coated Organic Photodiodes", Nano Letters, vol. 9, No. 3, Jan. 12, 2009, pp. 980-983.

* cited by examiner

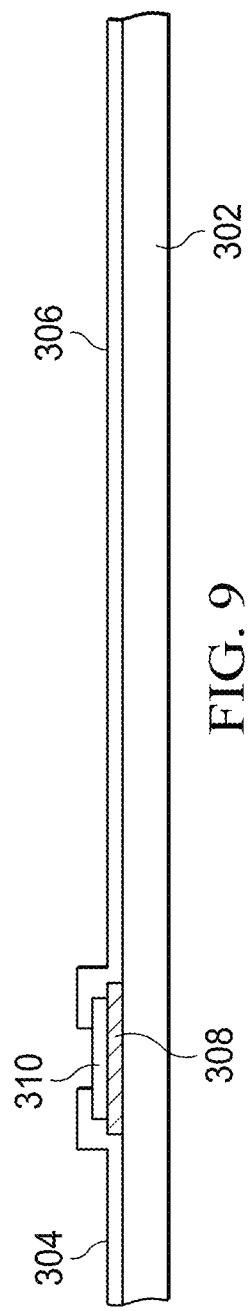
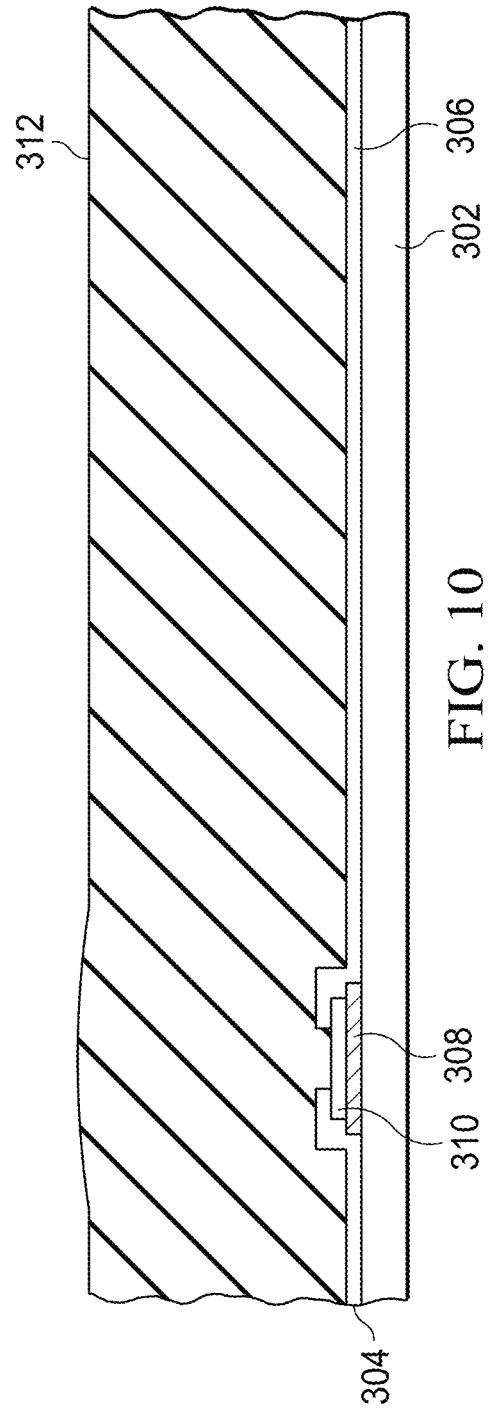

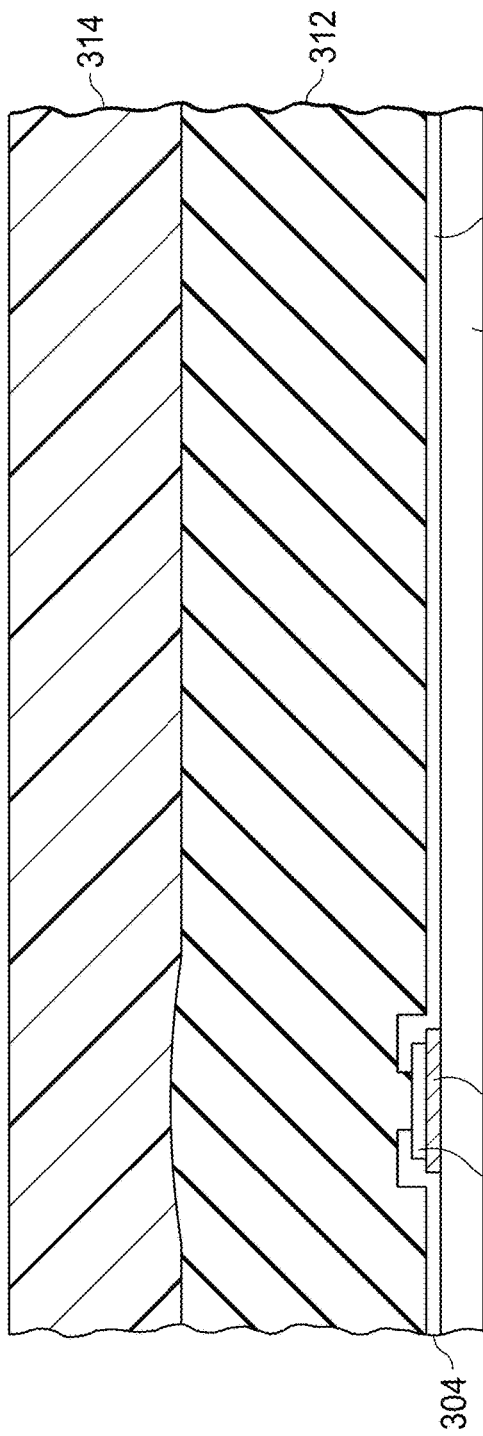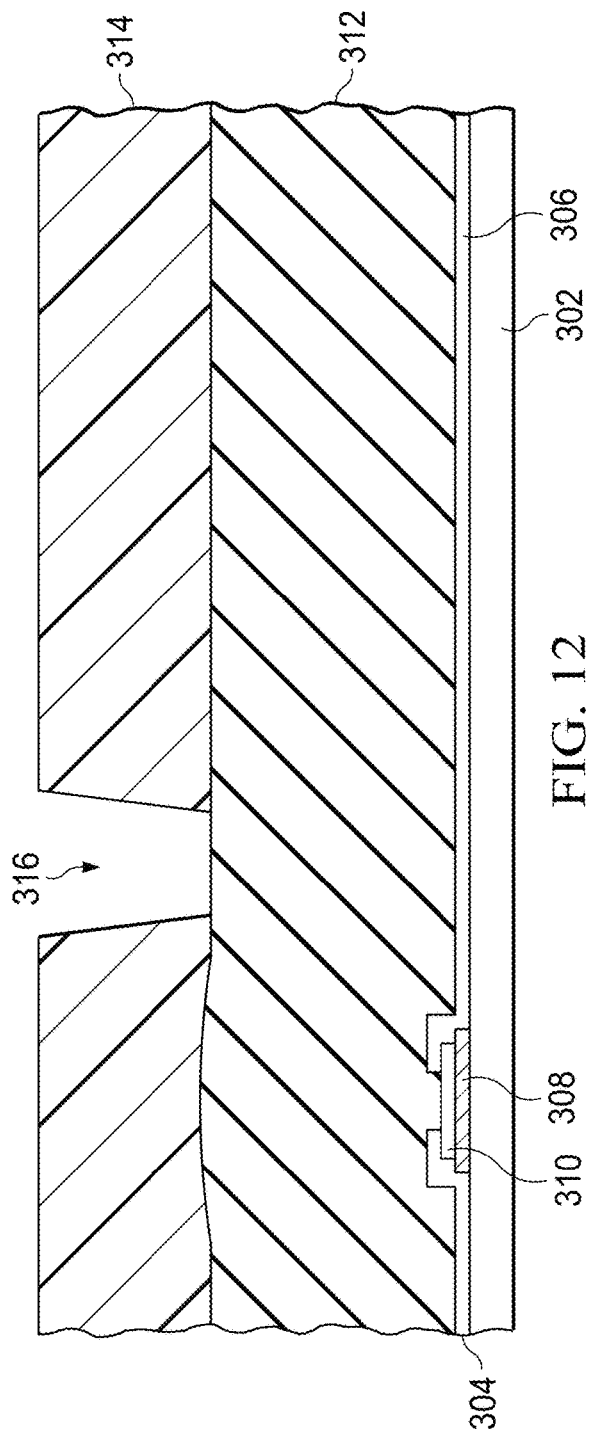

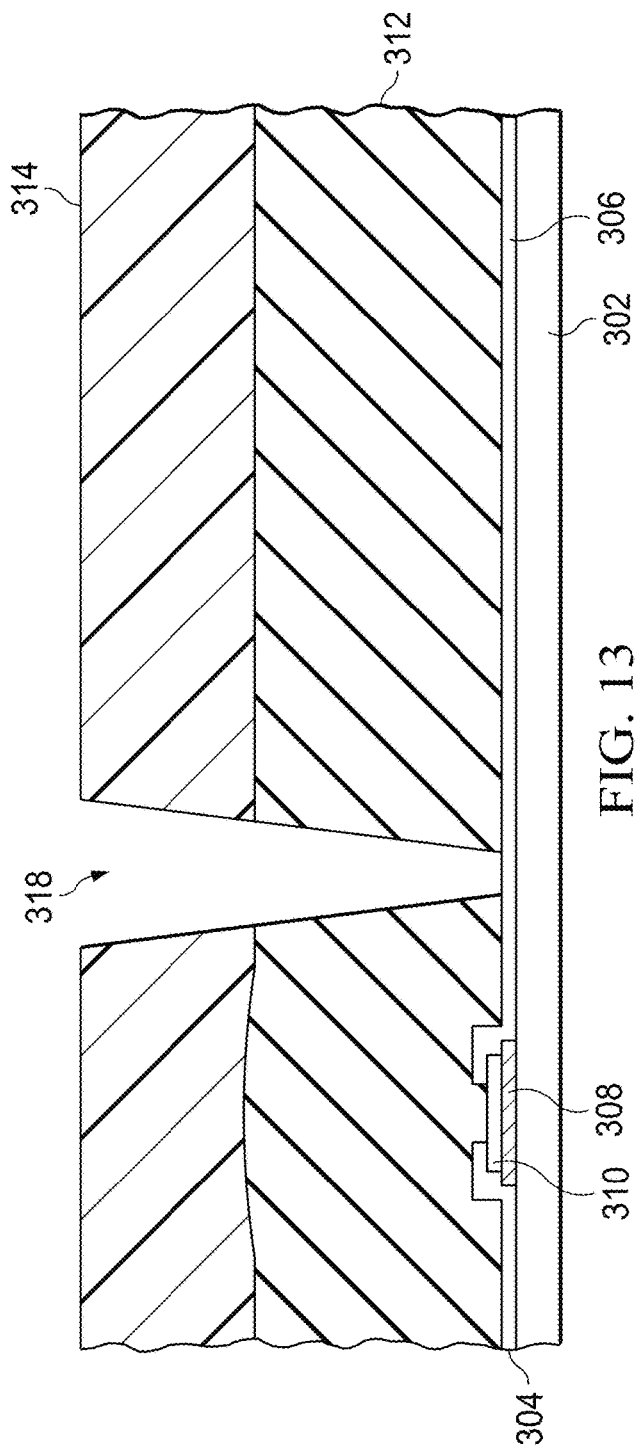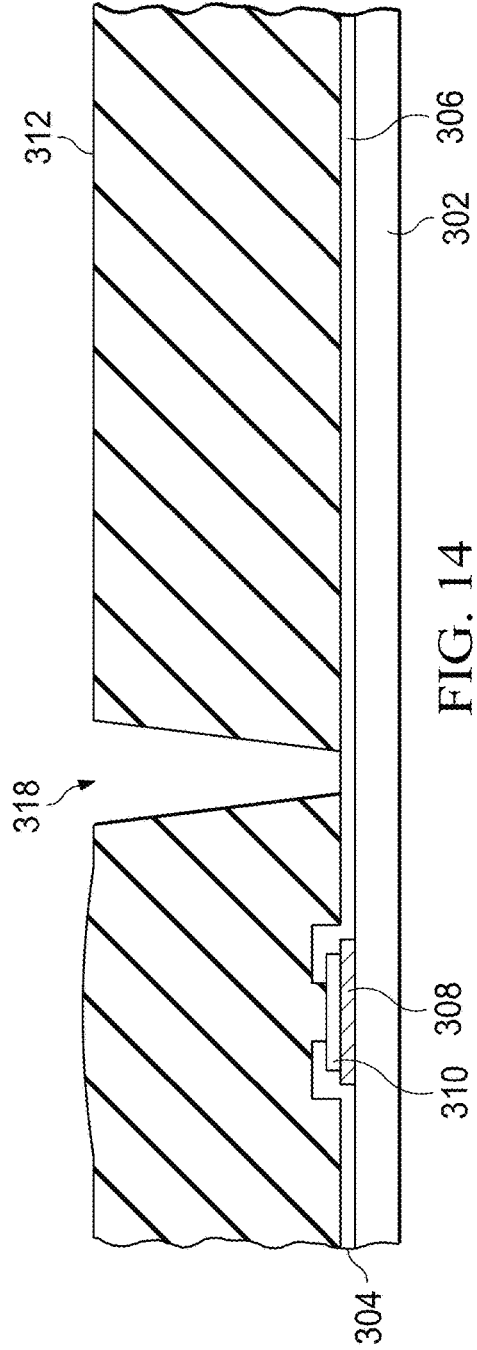
FIG. 13
FIG. 14

| LAYER | MATERIAL | NOMINAL THICKNESS | NOTES |
|---|---|---|---|
| GATE | Al, TiW | 1300A, 200A | PVD |
| GATE DIEL/CHANNEL/ISLAND | SiN, a-Si, SiN | 3300A, 500A, 1500A | PECVD |
| SOURCE/DRAIN | μc-Si, Cr | 500A, 800A | PECVD, PVD |
| INTERLAYER DIELECTRIC (ILD) | SiON | 15000A | PECVD |
| DIODE CONTACT AND DATA METAL | TiW, Al, TiW, ITO | 200A, 7000A, 200A, 200A | ITO IS TOP LAYER |
| BANK (OPTIONAL) | AD-BCB | ~20000A | SLOT DIE/EXTRUSION COATED TARGET SLOPE: ~60° |

FIG. 29

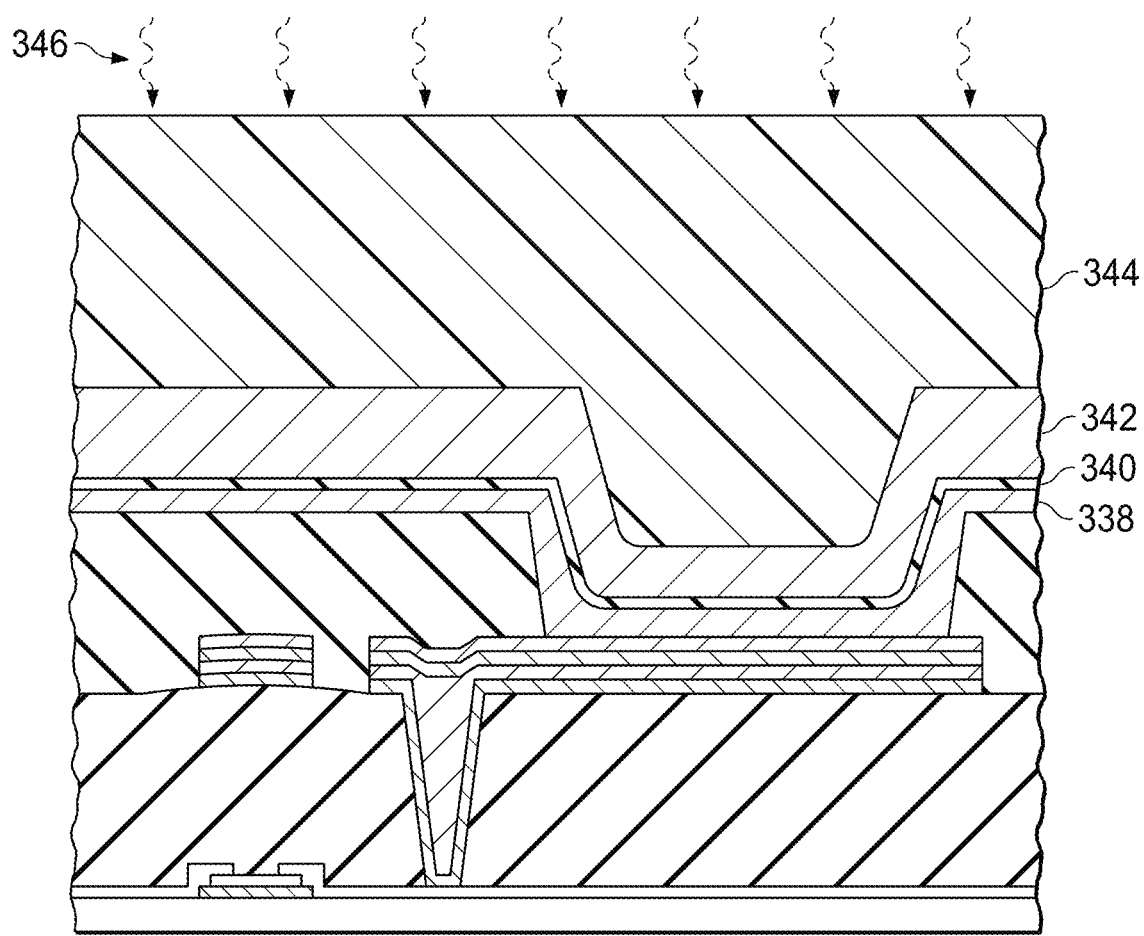
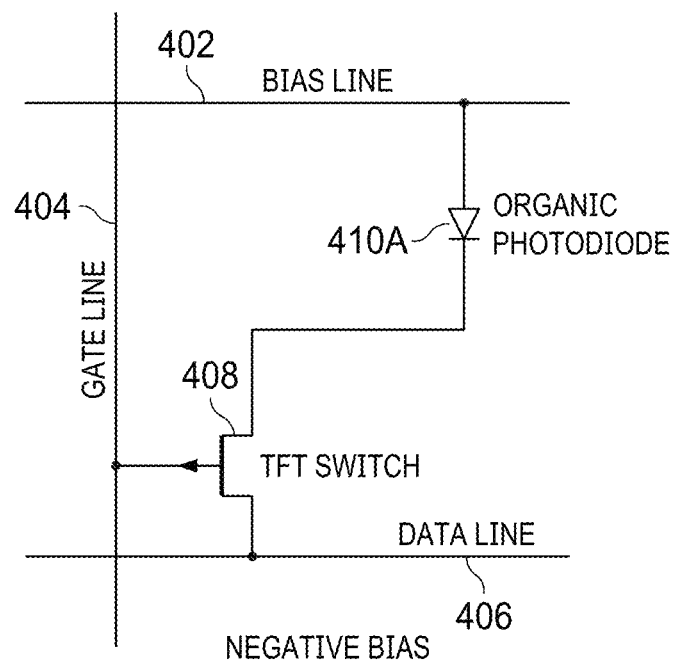
FIG. 30

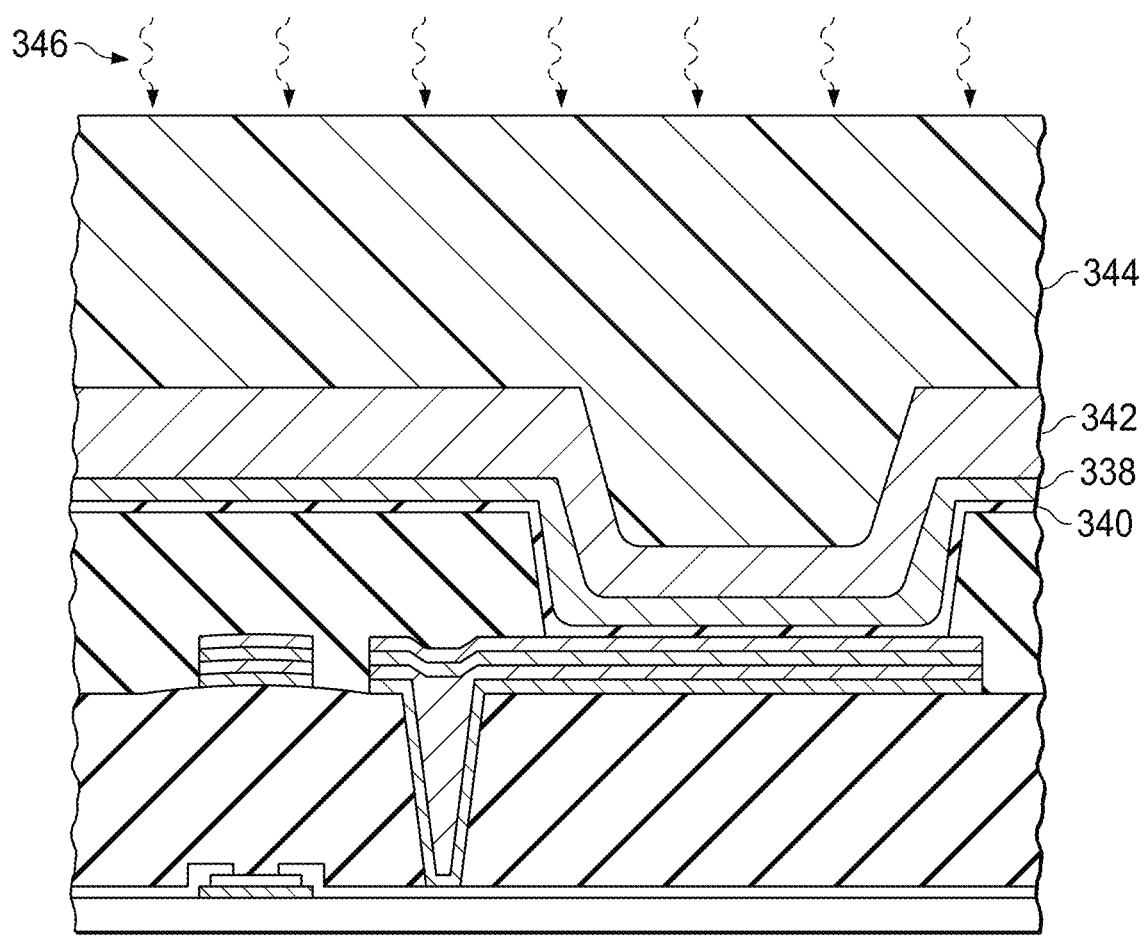
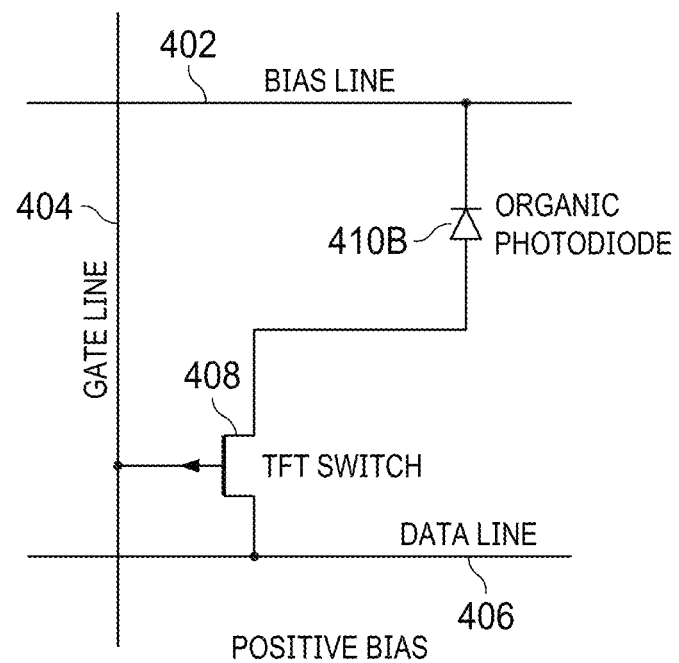
FIG. 31

METHOD OF MANUFACTURING AN ENHANCED HIGH PERFORMANCE IMAGE SENSOR DEVICE

CROSS-REFERENCE TO RELATED APPLICATIONS

This application claims the benefit of U.S. Provisional Application No. 62/725,147, filed on Aug. 30, 2018, which application is hereby incorporated herein by reference in its entirety.

TECHNICAL FIELD

The present invention relates to the design and method of manufacturing an enhanced high performance image sensor device.

BACKGROUND

Organic semiconductors offer a unique set of advantages for large area active matrix light detection applications. Organic semiconductor-based photosensors allow tailored spectral sensitivity from the ultraviolet to infrared spectrum, have low intrinsic stress, offer good photocarrier generation yield, allow for low temperature processing (offering easier integration with flexible substrates) and can be applied by solution process such as high speed printing techniques.

Designing and manufacturing a digital imaging array with an organic semiconductor-based organic photodiode (OPD) presents several challenges in adapting the technology to digital imaging system requirements for medical, industrial and homeland security applications.

SUMMARY

According to the present invention, an enhanced high performance active matrix photosensor array design, construction and manufacturing method is described. The photosensor array comprises a multilayer device containing a substrate, a thin film transistor, a single-layer or two-layer organic photodiode, a bias connection and a barrier layer. The device, as constructed, contains one or more dielectric layers to isolate the elements of the sensor. A gate electrode and data electrode are employed to provide scan and read-out of the device.

An enhanced high performance OPD photosensor according to embodiments can be fabricated using an architecture comprising a bulk heterojunction (BHJ) layer, a hole transport (HTL) layer, a top contact (TC) layer, and a moisture barrier (MB) layer. Alternatively, the enhanced high performance OPD photosensor according to embodiments can be fabricated using an architecture comprising only the BHJ, TC, and MB layers.

The design, construction and manufacturing methodology required to fabricate enhanced high performance, large area digital imaging arrays utilizing embodiment concepts is described in further detail below.

According to an embodiment, an image sensor comprises a substrate; a thin film transistor on the substrate; a dielectric layer over the thin film transistor; a stacked metal layer on and extending through the dielectric layer to the thin film transistor; a bulk heterojunction layer directly coupled to a top layer of the stacked metal layer; a hole transport layer directly coupled to the bulk heterojunction layer; and a top contact layer directly coupled to the hole transport layer, wherein the bulk heterojunction layer can comprise an electron donor/acceptor material, wherein the hole transport layer can comprise a conductive polymer material, wherein the top contact layer can comprise a transparent conductive material. In an embodiment, the image sensor can comprise a moisture barrier layer directly coupled to the top contact layer, wherein the moisture barrier layer can comprise an optically clear adhesive and a laminated transparent barrier film. In an embodiment, the bulk heterojunction layer and the hole transport layer can comprise a photodiode having an anode coupled to a bias line of the image sensor.

According to an embodiment, an image sensor comprises a substrate; a thin film transistor on the substrate; a dielectric layer over the thin film transistor; a stacked metal layer on and extending through the dielectric layer to the thin film transistor; a hole transport layer directly coupled to a top layer of the stacked metal layer; a bulk heterojunction layer directly coupled to the hole transport layer; and a top contact layer directly coupled to the bulk heterojunction layer, wherein the hole transport layer can comprise a conductive polymer material, wherein the bulk heterojunction layer can comprise an electron donor/acceptor material, wherein the top contact layer comprises a transparent conductive material. In an embodiment, the image sensor can comprise a moisture barrier layer directly coupled to the top contact layer, wherein the moisture barrier layer can comprise an optically clear adhesive and a laminated transparent barrier film. In an embodiment, the bulk heterojunction layer and the hole transport layer can comprise a photodiode having a cathode coupled to a bias line of the image sensor.

According to an embodiment, an image sensor comprises a substrate; a thin film transistor on the substrate; a dielectric layer over the thin film transistor; a stacked metal layer on and extending through the dielectric layer to the thin film transistor; a bulk heterojunction layer directly coupled to a top layer of the stacked metal layer; and a top contact layer directly coupled to a bulk heterojunction layer, wherein the bulk heterojunction layer can comprise an electron donor/acceptor material, and wherein the top contact layer can comprise a transparent conductive material. In an embodiment, the image sensor can comprise a moisture barrier layer directly coupled to the top contact layer, wherein the moisture barrier layer can comprise an optically clear adhesive and a laminated transparent barrier film. In an embodiment, the bulk heterojunction layer comprises a photodiode coupled to a bias line of the image sensor.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9-25 are cross-sectional views of method steps for manufacturing an OPD photosensor pixel cell according to an embodiment;

FIG. 29 is a table that shows the materials, nominal thickness, and manufacturing technique used in forming the various layers shown in the cross-sectional drawings of FIGS. 9-28;

FIG. 30 is a schematic diagram as well as a cross-sectional view of an OPD sensor array wherein the photodiode is negatively biased, according to an embodiment;

FIG. 31 is a schematic diagram as well as a cross-sectional view of an OPD sensor array wherein the photodiode is positively biased, according to an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
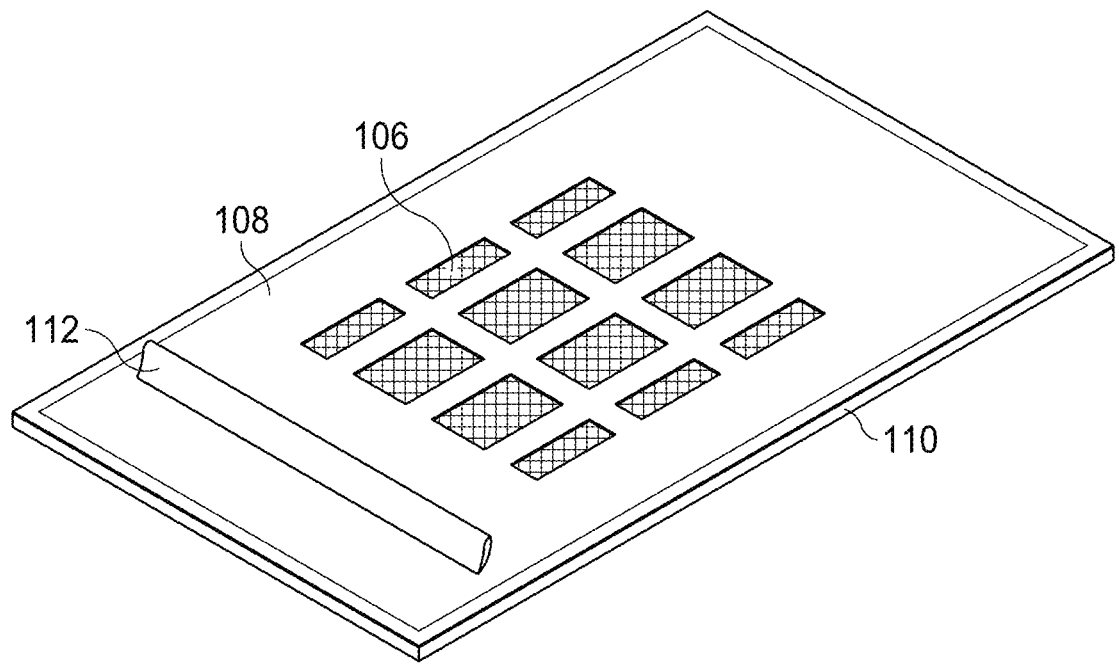
FIGS. 1-4 illustrate method steps for manufacturing OPDs using screen printing techniques according to the present invention.

Among the various aspects of the present invention is the provision of photosensor arrays, particularly photosensors for the detection of radiation elements, and related methods. Further provided are methods of manufacturing a sensor element comprising thin film transistors, used as the switching element, that are electrically connected to an organic photosensor element to provide readout operations with relatively fast switching and low noise.

In general, exemplary organic photosensors can comprise a thin film transistor having an amorphous silicon, metal oxide, or low temperature polysilicon channel, a photo sensing element comprising an electron transport layer (ETL), a bulk heterojunction layer (BHJ), a transparent hole transport layer (HTL), and a transparent top contact (TC), or anode, contacted to a global bias grid and a moisture barrier (MB) structure separating the photosensor array from ambient water vapor to mitigate degradation of the TFT and photodiode during normal operation.

While the above formulation works well for an OPD photosensor array, the OPD photosensor array according to embodiments described herein reduces manufacturing complexity and attendant costs (and improves performance) by simplifying the manufacturing process to eliminate the electron transport layer in an embodiment, and to eliminate both the electron transport layer and the hole transport layer in another embodiment. Thus, in a first embodiment, the OPD photodiode comprises a bulk heterojunction layer directly coupled to a stacked metal layer, a hole transport layer directly coupled to the bulk heterojunction layer, a top contact layer directly coupled to the hole transport layer, and a moisture barrier directly coupled to the top contact layer. In a second embodiment, the OPD photodiode comprises a hole transport layer directly coupled to a stacked metal layer, a bulk heterojunction layer directly coupled to the hole transport layer, a top contact layer directly coupled to the bulk heterojunction layer, and a moisture barrier directly coupled to the top contact layer. In a third embodiment, the OPD photodiode comprises a bulk heterojunction layer directly coupled to a stacked metal layer, a top contact layer directly coupled to the bulk heterojunction layer, and a moisture barrier directly coupled to the top contact layer.

According to embodiments, a method of depositing the BHJ, HTL and TC layers is slot-die coating; however alternative methods can comprise screen printing, inkjet printing or spray coating. Slot-die coating advantageously includes the ability to deposit thin, uniform coatings. The BHJ formulations typically are low viscosity materials and are easily filtered to remove aggregates that form in the solution. The viscosity of the TC chemicals can vary. Slot die coating advantageously has the ability to form repeatable, uniform coatings. Alternative methods of deposition, such as screen printing are more viscous and difficult to filter, thus producing more defects in the image quality of the photosensor array. However, screen printing offers several advantages including high throughput and ease of artwork/design changes. Embodiment methods utilize vacuum filtering of the BHJ screen printing material to remove particle aggregation, thus advantageously allowing more defect-free images. Embodiment methods also utilize the ability to coat the TC layer using screen printing techniques as well.

The method of manufacturing OPDs using screen printing techniques offers a repeatable, robust and cost efficient manufacturing process over other methods currently used. The screens are easy to clean as well as change from one production layout to another. Screen printing equipment and screen costs are cheaper than other equipment used for manufacturing OPDs.

Figure 2:
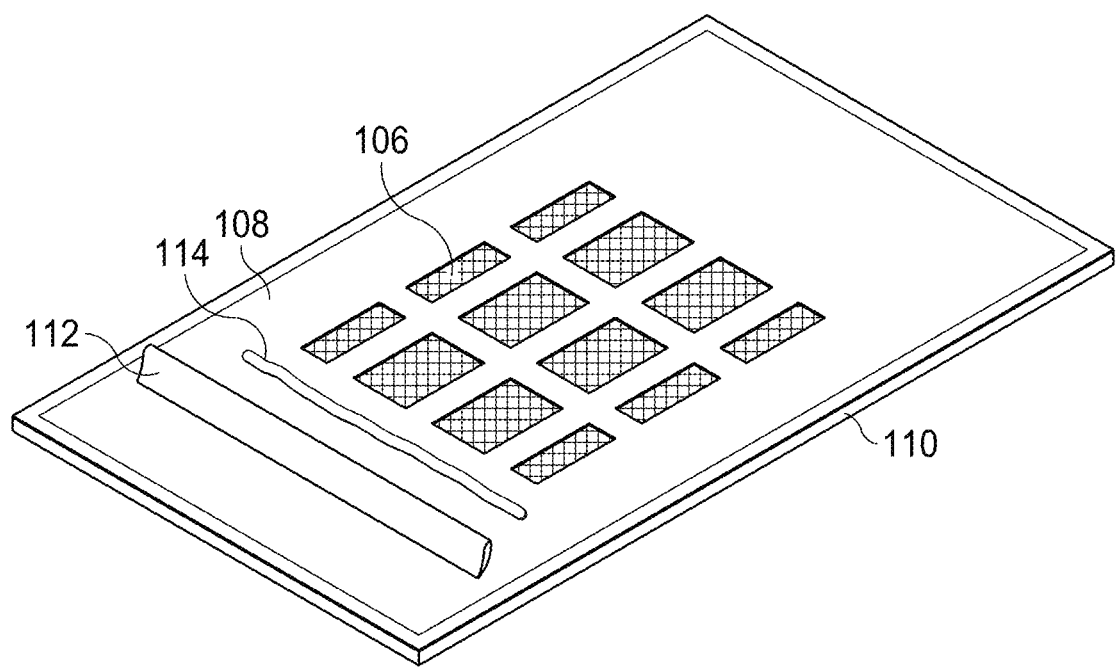
Figure 3:
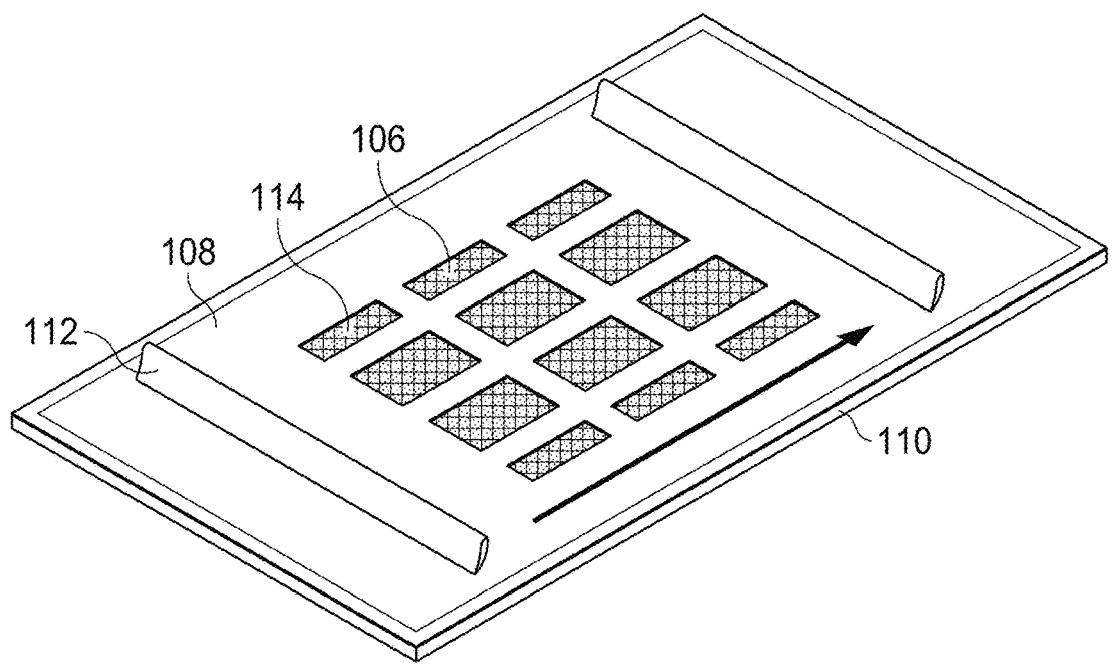
Figure 4:
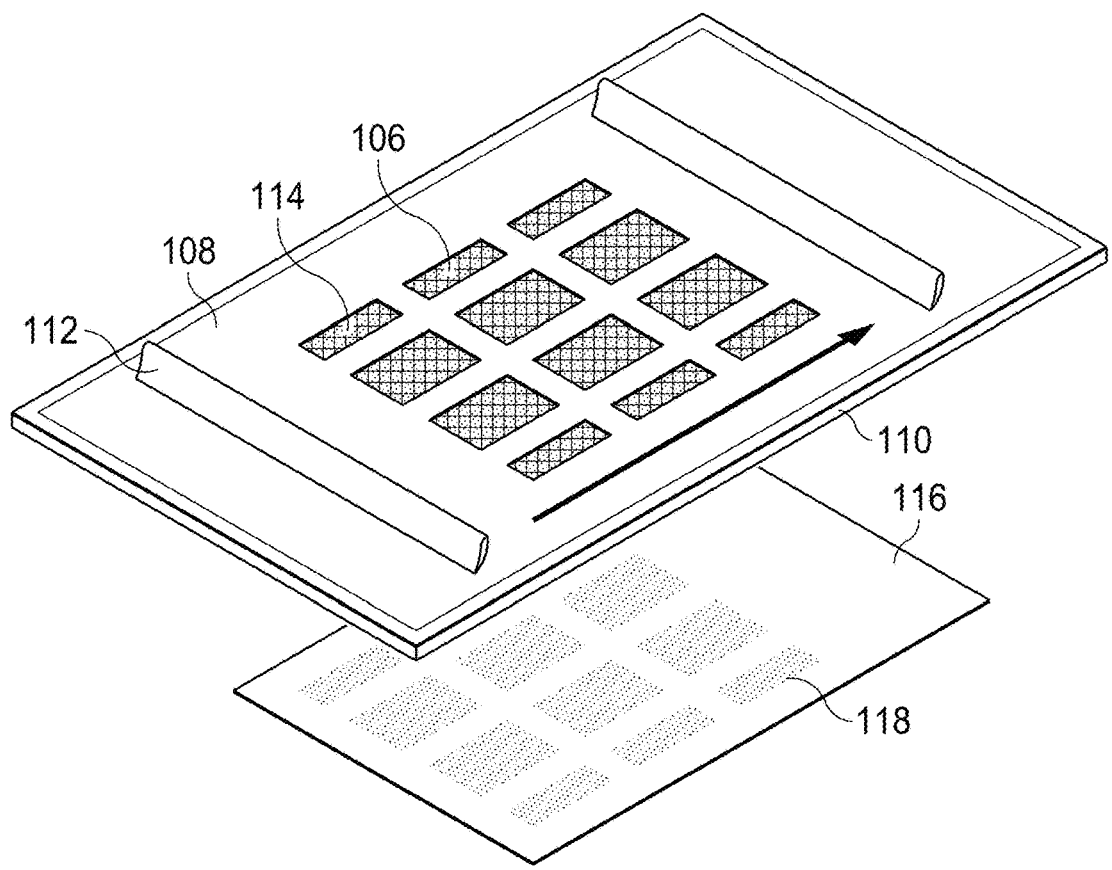

In an embodiment, the application of the photoactive layer (PAL) of the image sensor using a screen printer is achieved by forcing chemical through a screen mesh with a squeegee and onto the substrate. The screen is comprised of an aluminum frame glued to a screen mesh. An emulsion is then applied onto the mesh, covering the areas that are not allowed to transfer the chemical to the substrate. An example of the mesh and squeegee is provided below in FIG. 1. The chemical is placed onto the screen, either by automatic control or manually. An example of this step is shown below in FIG. 2. Then the squeegee pushes downward onto the screen and moves forward forcing the chemical into the mesh as is shown in FIG. 3. The chemical contacts the substrate while the squeegee pushes downward and moves across the screen; thus, transferring the chemical in the form of the pattern onto the substrate as is shown in FIG. 4.

In an embodiment, the application of the BHJ layer, using a screen printer is achieved by forcing chemicals through a screen mesh with a squeegee and onto the substrate. The screen is comprised of an aluminum frames glued to a screen mesh. An emulsion is then applied onto the mesh, covering the areas that are not allowed to transfer the chemical to the substrate. An example of the mesh and squeegee is shown in FIG. 1. FIG. 1 shows a screen mesh 106, a screen 108, a screen frame 110, and a squeegee 112. In FIG. 2, the OPD chemical 114 such as the BHJ layer is placed onto the screen, either by automatic control or manually. In FIG. 3, the squeegee 112 pushes downward onto the screen 108 and is moved forward from a first position to a second position, forcing the chemical into the mesh. In FIG. 4, the chemical 114 in the mesh contacts the substrate while the squeegee pushes downward and moves across the screen 108, thus transferring the chemical in the form of the pattern 118 onto the substrate 116.

The screen 108 is much lighter than a comparable nozzle for a slot-die coater. The cost of the squeegee 112 as well as the cost of the screen 108 is much less than the cost for a comparable nozzle. As stated earlier, the printed layout can be changed by removing the screen from the tool, either by hand or by a tool suited to the width of the screen, and replaced it with a screen that has the new layout.

The film thickness can be controlled by several conditions, such as the speed in which the squeegee moves across the screen, the mesh count of the screen, and the viscosity of the chemical. The quality of the film coat can also be controlled by the methods above, but also by the angle of the squeegee, the hardness of the squeegee, the distance of the screen with the substrate, and the pressure the squeegee applies to the screen as it moves across the screen.

Two known methods for depositing the TC layer are slot-die coating and evaporation. The approach of the present invention of depositing the TC layer using a screen printer over slot-die coating is the same as previously discussed with respect to the active layer. The approach of the embodiment methods of screen printing over evaporation of the TC layer is that the films can be more light transparent. The most common evaporated TC layer material is silver. A silver film blocks over 60% of visible light between the frequencies of 450 nm and 850 nm at its thinnest conductive layer. The screen printer allows the use of other materials such as silver nanowire or transparent conductive ink to act as the TC layer. These materials are more transparent than evaporated silver while still providing sufficient conductivity to ensure the proper functionality of the photo diode array.

Vacuum filtering, according to embodiments, is a technique used to filter, or separate, unwanted material from a solution. The filtering process works by applying a pressure differential between a source container and a receiving container. Air is sucked out of the receiving container pulling the material in the source container through a filter material that blocks the unwanted material from passing. Embodiment methods use this technique to filter out unwanted aggregates from the BHJ material, thus decreasing the defectivity of the deposited material in the photosensor array. The practice of vacuum filtering in the invention is unique because disc filtering is used to filter OPD materials, such as the BHJ material.

Figure 5:
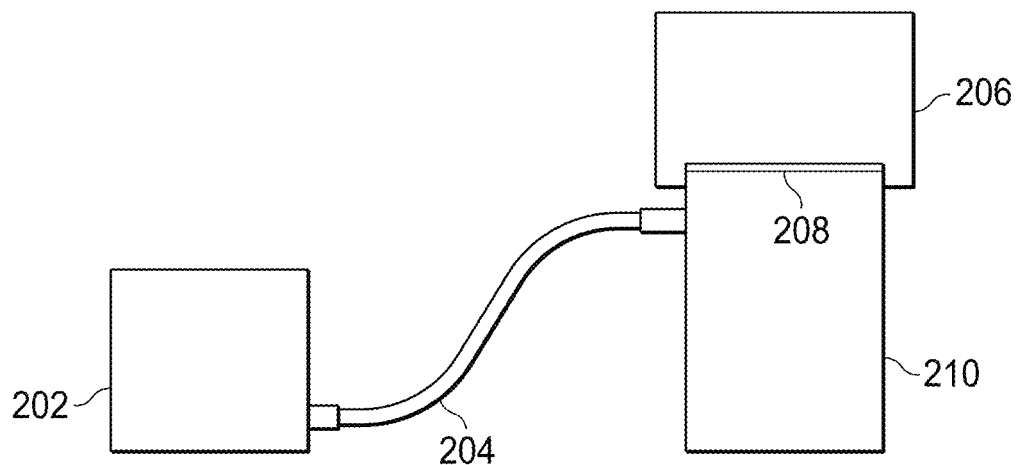
FIGS. 5-8 illustrate method steps for a vacuum filtering technique according to the present invention.
Figure 6:
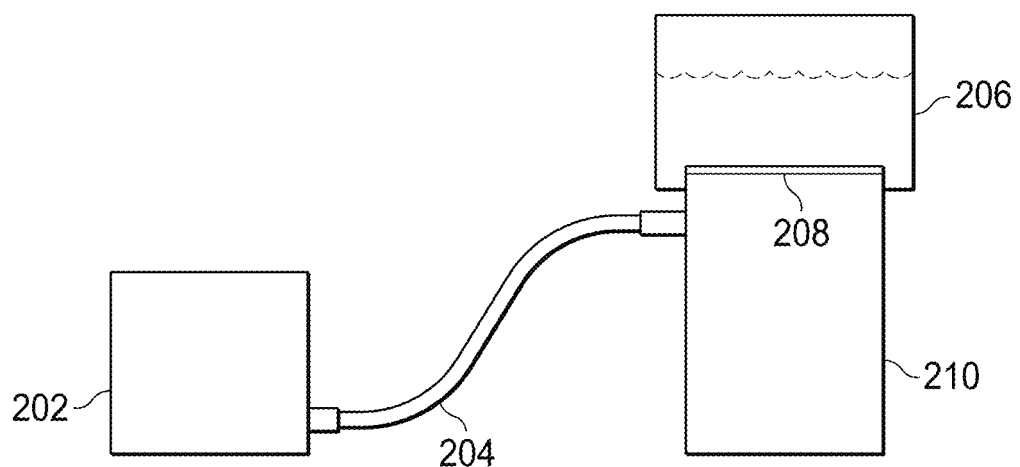
Figure 7:
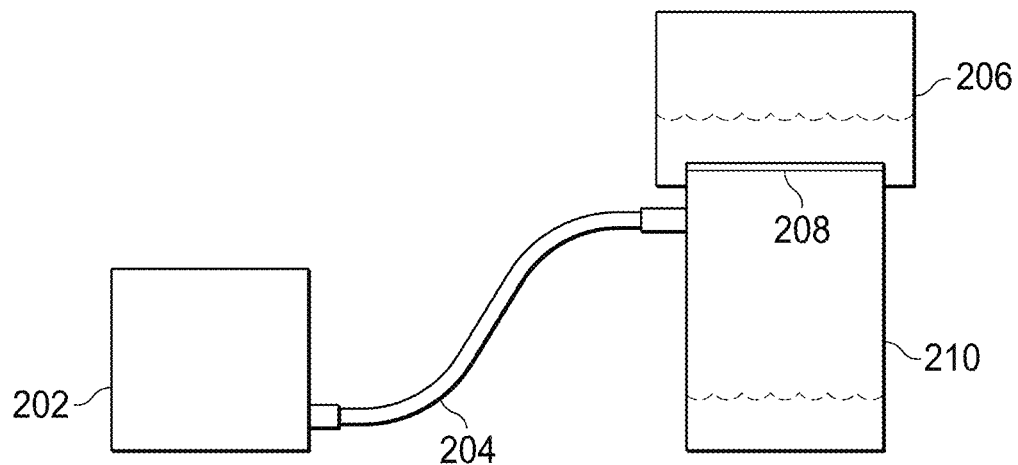
Figure 8:
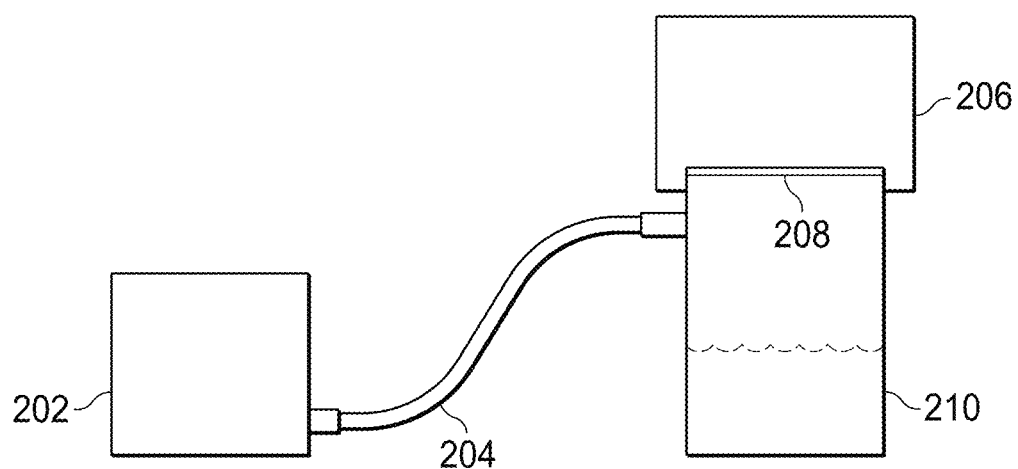

A basic filtration system according to embodiments comprises a source container 206, a receiving container 210, a filter material 208, a vacuum pump 202, and a vacuum line 204. An illustration of the filtration system is provided in FIG. 5. A user first places the BHJ material in the source container 206 and connects the vacuum line 204 to the receiving container 210 as is shown in FIG. 6. Turning on the vacuum pump 202 creates a pressure differential between the source container 206 and the receiving container 210. The lower pressure in the receiving container causes the BHJ material to be pulled through the filter 208 as is shown in FIG. 7. The filtering action filters out unwanted aggregates in the BHJ material as the filtered BHJ material goes into the receiving container 210 as is shown in FIG. 8.

Embodiment methods improve performance of a typical organic photosensor by decreasing the necessary layers from four to three (BHJ, HTL, TC) or just two (BHF, TC) to create the organic photodiode within the photosensor array. The embodiment architecture allows costs and manufacturing complexity to be reduced and improves sensitivity, or responsiveness to light and lag, or the ability to deplete the collected charge during the readout phase of the detector. This enhanced organic photodiode architecture also maintains low leakage as compared to the traditional four-layer architecture.

A thin film transistor is electrically connected to the photosensing element, or organic photodiode, and the thin film transistor and photosensing element are formed on a glass or plastic substrate, the photosensing element is connected via a global bias connection and the entire device is encapsulated with a moisture barrier as is explained in further detail below.

According to embodiments, a photosensor pixel cell comprises a substrate, a pixel, a gate line, and a data line disposed on the substrate. The photosensor pixel comprises an amorphous silicon semiconductor thin film transistor connected to the gate line and the data line, a photosensing element, a bias electrode and a moisture barrier as is also explained in further detail below.

A traditional method of applying a moisture barrier on an amorphous silicon photosensor is to deposit SiO2 followed by a SiN cap. An embodiment moisture barrier utilizes an optically clear adhesive followed by a laminated transparent barrier film and edge sealed with a moisture resistant epoxy. This moisture barrier provides robust protection against moisture degradation of the photosensor array. The optically clear adhesive is applied onto the organic photosensing array first by using a hand roller followed by a lamination tool to ensure good adhesion between the adhesive film and the array.

FIGS. 9-25 are cross-sectional views of method steps for manufacturing an OPD photosensor pixel cell according to an embodiment.

FIG. 9 shows a portion of a Thin-Film Transistor ("TFT") array including a glass or plastic substrate 302, a data line 304, a line 306 for coupling the TFT to the photodiode stack of the sensor array, a gate 308, and an island 310. The substrate 102 is typically glass, but a plastic substrate (using polyethylene naphthalate, polyethylene terephthalate, or polyimide) can also be used. The material for lines 304 and 306 is typically Chrome ("Cr") with a nominal thickness of about 500 Angstroms, in an embodiment. The material is deposited using Physical Vapor Deposition ("PVD"). The material for gate 308 can include Aluminum ("Al") with a nominal thickness of about 1300 Angstroms combined with Titanium Tungsten ("TiW") with a nominal thickness of about 200 Angstroms. The material for gate 308 can be applied using Physical Vapor Deposition ("PVD"). The gate 308 dielectric material can be Silicon Nitride ("SiN") having a nominal thickness of about 3300 Angstroms, amorphous Silicon ("a-Si") having a nominal thickness of about 500 Angstroms, or SiN having a nominal thickness of about 1500 Angstroms. The material for the gate 308 dielectric can be applied using Plasma-Enhanced Chemical Vapor Deposition ("PECVD"). The active portion (island 310) of the TFT is formed of microcrystalline Silicon ("μc-Si silicon") having a nominal thickness of about 500 Angstroms and a Chromium layer ("Cr") having a nominal thickness of about 800 Angstroms. The island 310 can be formed using both PECVD and PVD, in embodiments.

FIG. 10 shows the application of an Inter-Layer Dielectric ILD film layer 312 (ideal thickness 0.5 um to 2.0 um) onto the TFT layer of FIG. 9 using PECVD. The PECVD process temperature is ideally between 200° C. and 300° C. ILD materials can include SiON or SiO2 and SiN, in embodiments.

FIG. 11 shows the application of a photoresist layer 314 used to pattern a via in the ILD layer 312, according to embodiments.

FIG. 12 shows the photoresist layer 314 is exposed to light such that portion 316 will be preferentially etched for the subsequent via in the ILD layer 312. The photoresist layer 314 can be a positive-toned, novalac-based resin material. The typical thickness of the material is between 2.0 um to 8.0 um and it is deposited using an extrusion coater, or slit coater.

FIG. 13 shows the etching of the SiON (or other PECVD dielectric) ILD layer 312 using either wet (HF type chemistry) or dry (F plasma; ideally CF4 or SF6) to create the via 318 used to contact metal layer 306.

FIG. 14 shows the removal of the photoresist layer using a photoresist strip chemical.

Figure 15:
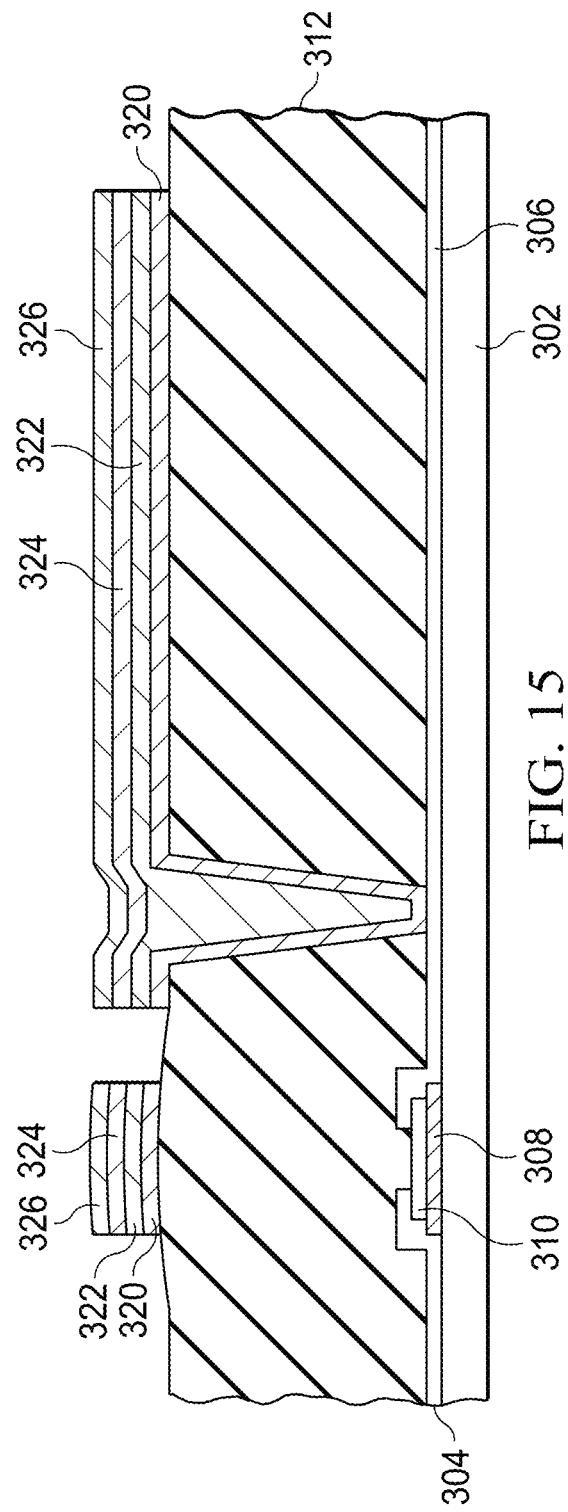

FIG. 15 shows the deposition of a metal stack including layers 320, 322, 324, and 326. The metal layers are patterned into two patterned stacks to form the light shield for the TFT (left patterned stack) and also to form the bottom contact, or cathode of the photodiode (right patterned stack). The metal interconnect layer is deposited by PVD/sputtering. This process comprises using a quad-layer metal stack, beginning from the bottom layer 320, of TiW, Al, TiW, and ITO or Chrome, Al, TiW, and ITO. Typical film thickness is 200 Angstroms to 1000 Angstroms for the first layer 320, 1000 Angstroms to 10000 Angstroms for the Al layer 322, 200 Angstroms to 1000 Angstroms for the third layer 124, and 100 Angstroms to 800 Angstroms for the fourth layer 326. All depositions are performed at a temperature of less than 100° C. Alternatives to this approach include replacement of Cr or TiW with other refractory metals (examples include Mo, MoW, Ti, and other such materials), alternative conductors from Al (examples include Cu, Al:Nd, Al:Si, Ag, and other such materials or combinations of materials). Alternatively, the fourth layer 326 can be replaced with a conductive oxide, including but not limited to Indium Tin Oxide (ITO), Indium Gallium Zinc Oxide (IGZO), Indium Zinc Oxide (IZO), Indium Tin Zinc Oxide (ITZO), or Aluminum doped Zinc Oxide (AZO). Once the metal stack has been deposited, it is patterned and etched using a photoresist layer and an etching step (not shown in FIG. 15).

Figure 16:
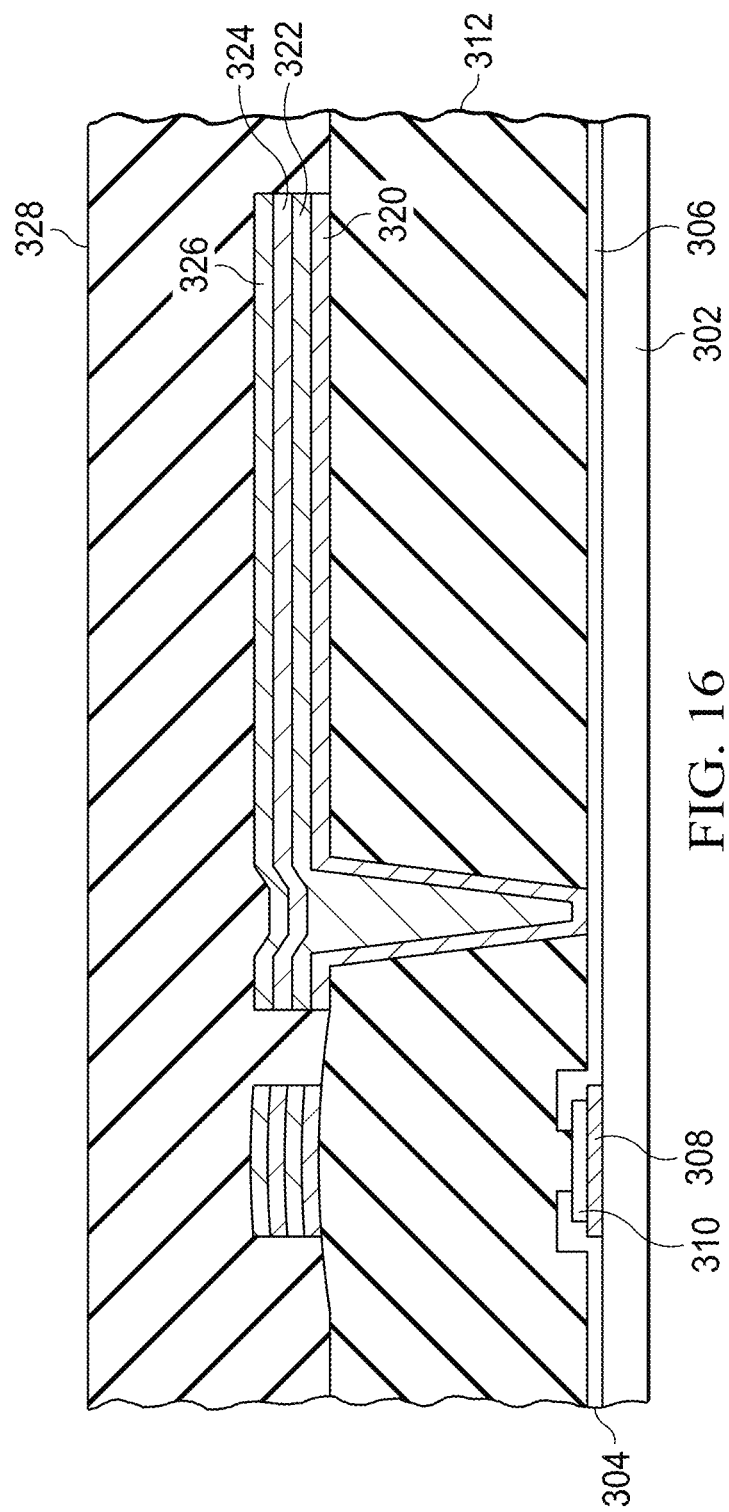

FIG. 16 shows the deposition of a bank layer 328, which can be a resin material. The bank layer 328 is deposited on the ILD layer 312 and the patterned metal layers 320, 322, 324, and 326, using a solution process (i.e. extrusion, slot die, spin coating, spray coating or inkjet). The ideal thickness of the bank layer 328 is between 1.0 µm to 6.0 µm. The bank layer 328 is deposited at an ambient temperature followed by a soft bake (to remove solvents) at T=50° C. to 100.degree. C. The bank layer 328 materials may include (but not limited to) Dow Chemical Cyclotene 6100 series (or variants thereof), Honeywell PTS series, Microchem SU-8, TOK TPIR PN-0371D or other such resin materials or self-priming low stress Aqueous Developable Benzocyclobutene (AD-BCB) photodielectric materials that are known in the art. The bank material described above provides excellent planarization (>90%) over the entire substrate.

Figure 17:
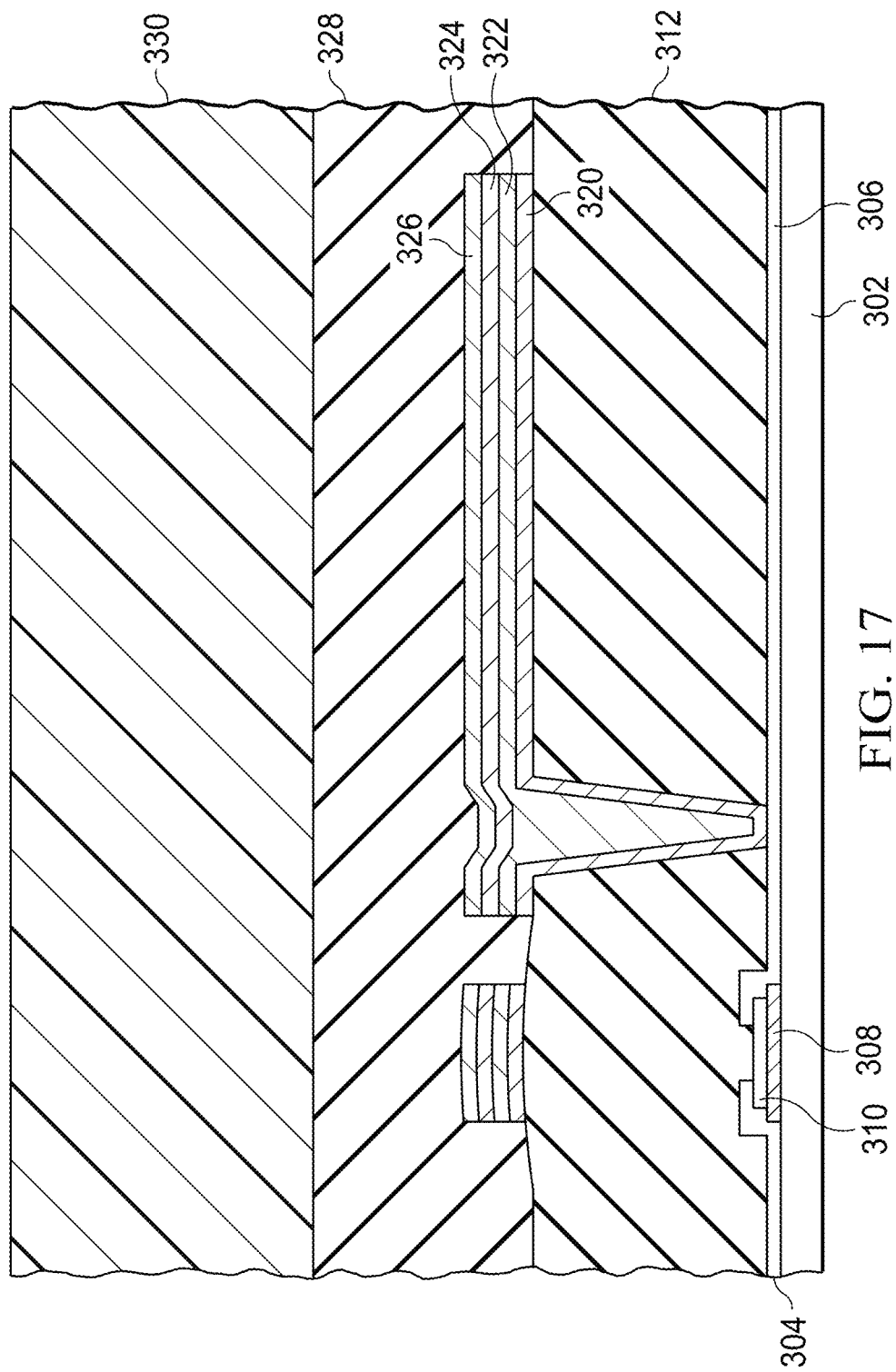

FIG. 17 shows the application of a photoresist layer 330 to an upper surface of the bank layer 328. The bank material in layer 328 is cured (T=200° C. to 300° C.; ideally less than 250° C.) in an N2 atmosphere for 1-6 hours followed by coating with the photoresist layer 330, which is a positive-toned, novalac-based resin material. The typical thickness of the material is between 2.0 µm to 8.0 µm and it is deposited using an extrusion coater, or slit coater.

Figure 18:
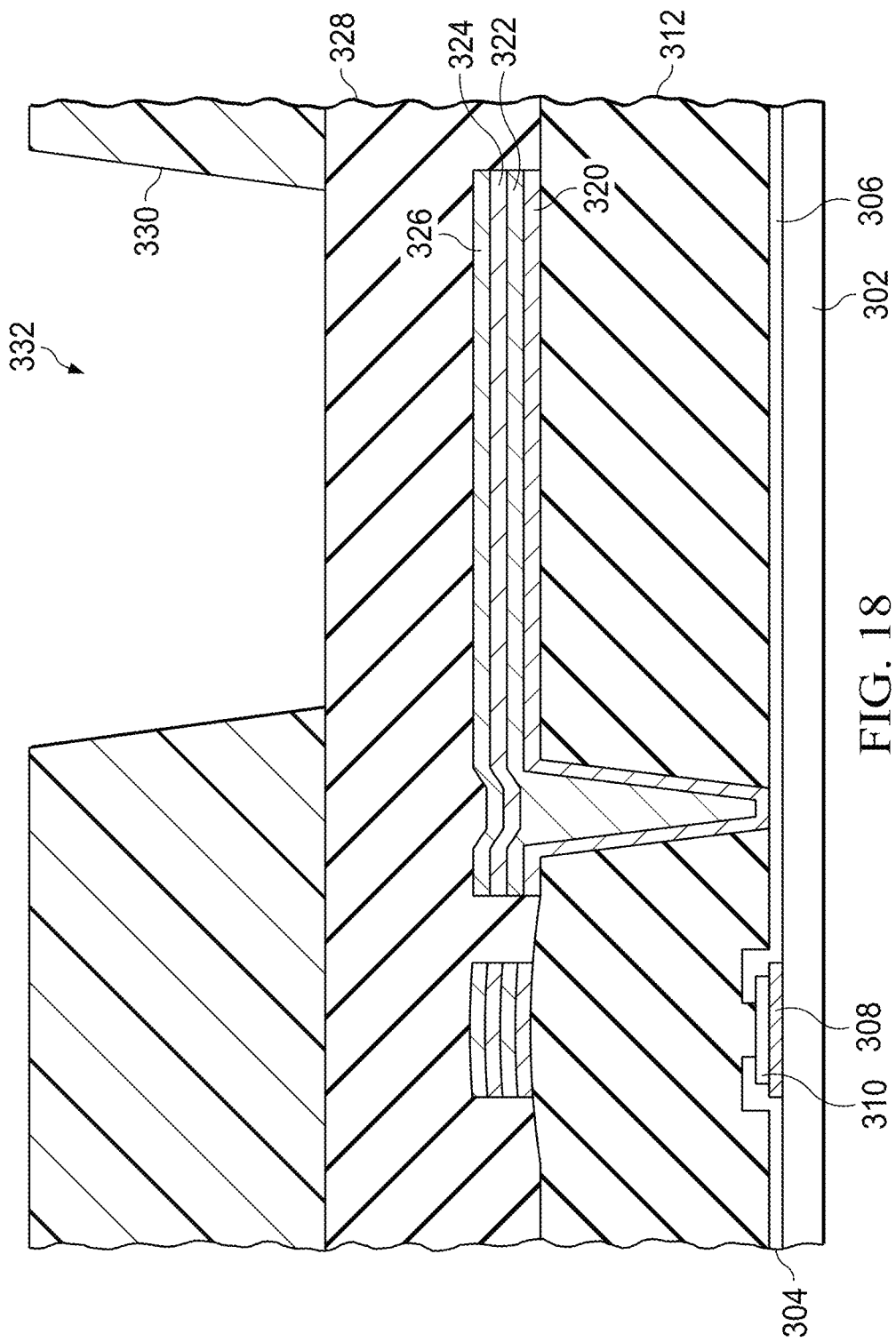

FIG. 18 shows the patterning of the photoresist layer 330 at portion 332. The photoresist is patterned by i-line exposure and developed to form individual pixel wells down to the bank layer 328. A typical dose range is 75 mJ to 200 mJ (ideally 90-125 mJ) and the thickness of the photoresist layer is between 1.0 µm to 10.0 µm, ideally 2.0 µm to 5.0 µm, in an embodiment.

Figure 19:
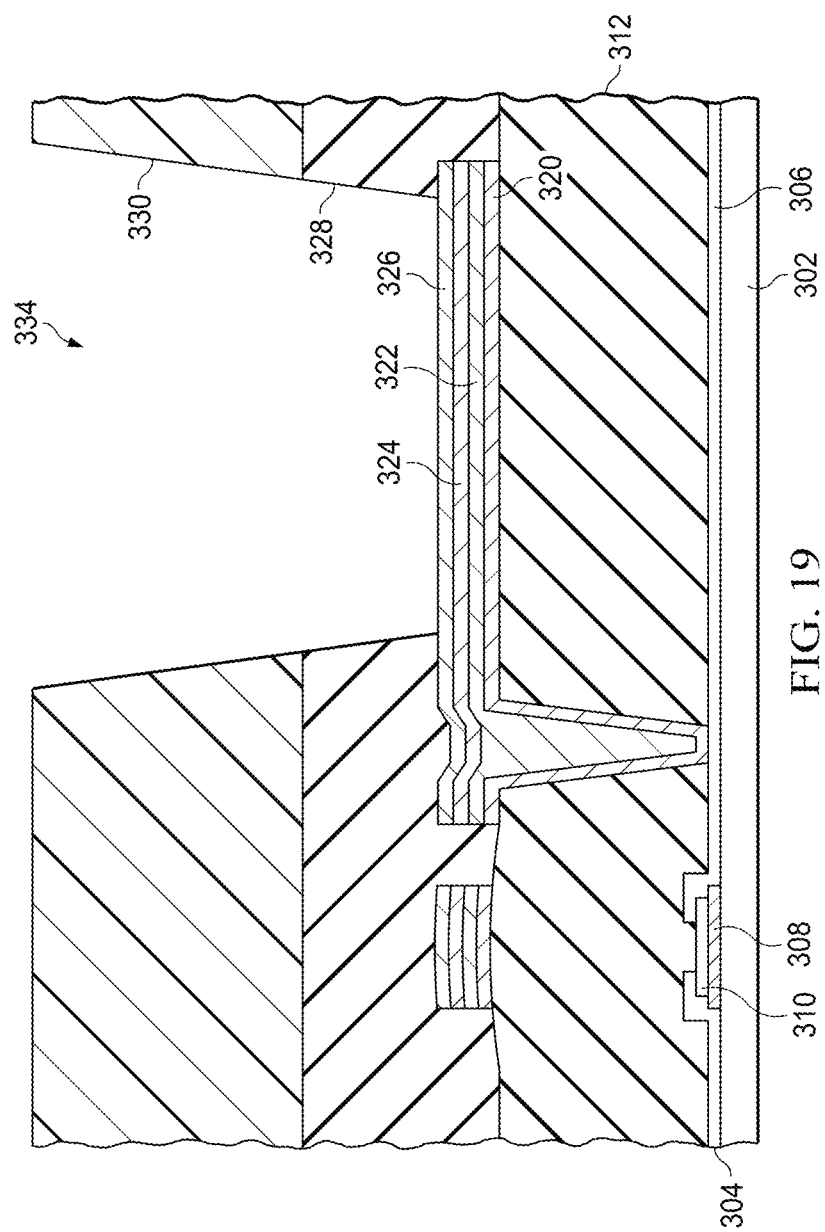

FIG. 19 shows via 334 formed through the photoresist 330 and bank layer 328. Following inspection, the individual pixel wells formed by via 334 are etched, using an F-containing (i.e. CF4, SF6, or similar material) plasma process, into the bank layer 328. Note that the upper surface of metal layer 326 is exposed.

Figure 20:
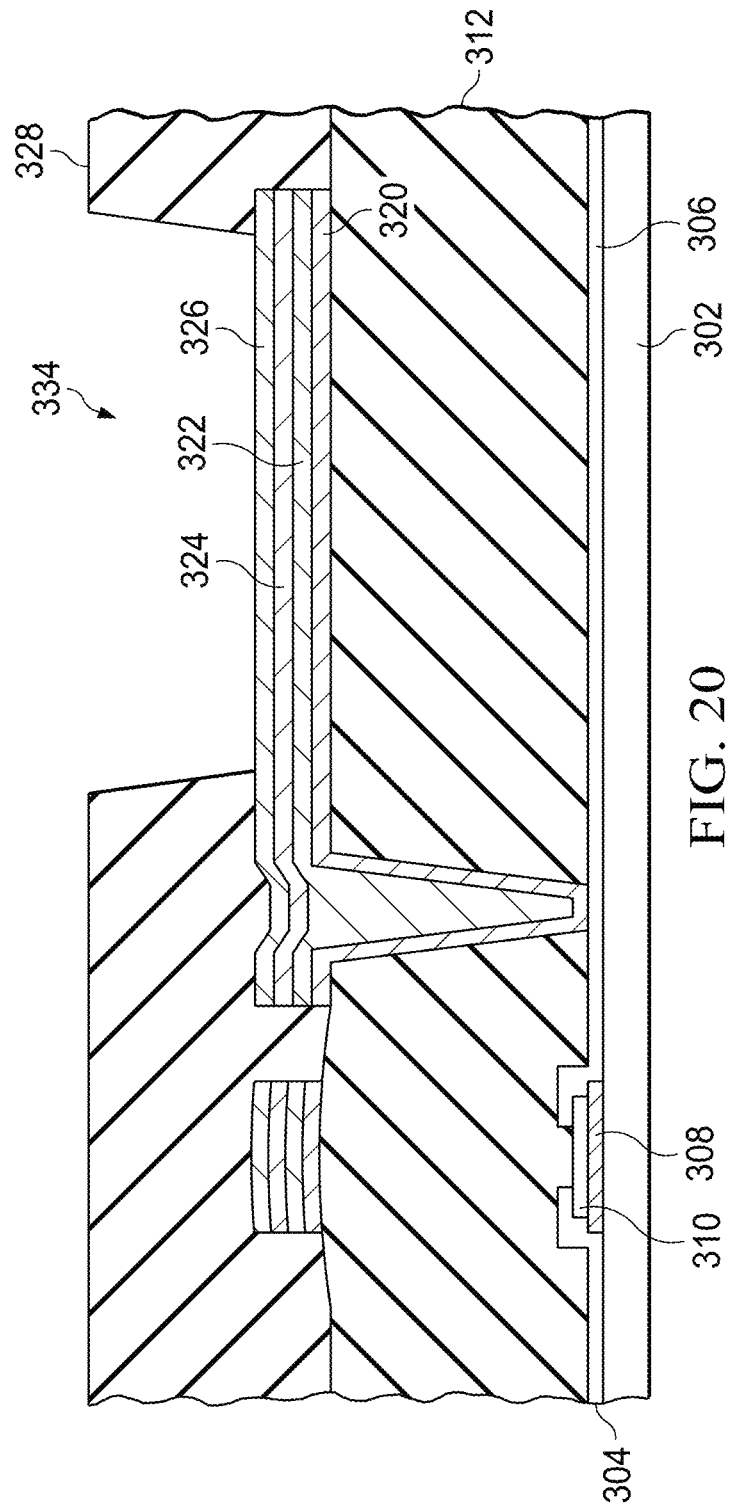

FIG. 20 shows that the photoresist layer 330 is removed. The photoresist layer 330 is stripped (using a PRS-2000 stripper or other strippers known in the art). The bank layer 328 material is immune to the strip chemistry and remains as part of the device. Following the strip process, the individual pixel wells are formed to create the organic photodiode later in the process, as will be explained in further detail below. It is also worth noting that the bank layer 328 material is highly planar, thus providing excellent dielectric separation between the metal layer features.

Figure 21:
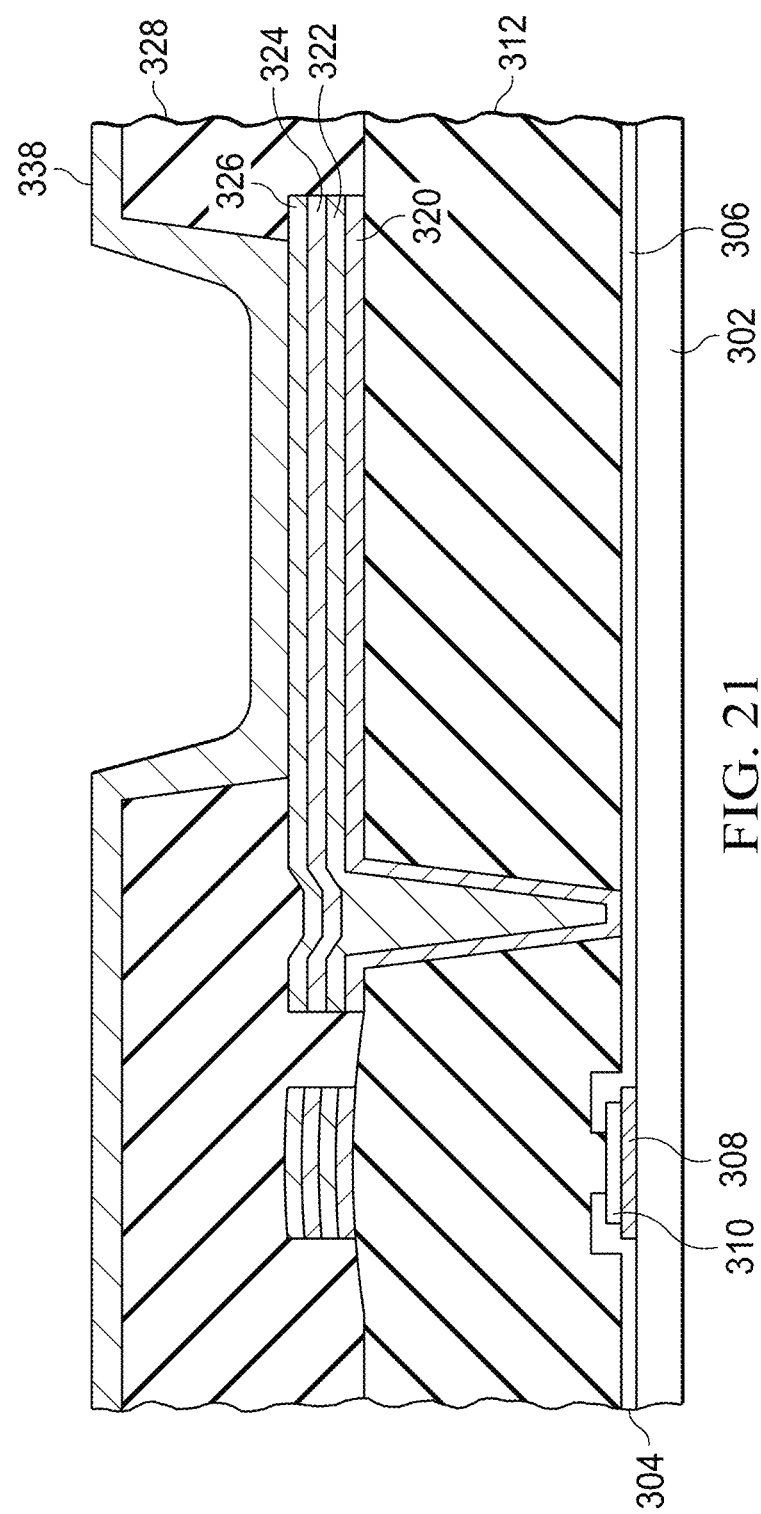

FIG. 21 shows the deposition of the Bulk Heterojunction Layer ("BHJ") 338. Note that the BHJ layer 338 is deposited directly on the surface of metal layer 326. The BHJ layer 338 has the function of converting light into electrical charge. The BHJ comprises a donor/acceptor material mixed in a solvent or solvents. The electron donor material is typically, but not exclusively, poly(3-hexylthiophene) ("P3HT") and the electron acceptor is typically phenyl-C61-butyric acid methyl ester ("PC61BM" or "C60"). The BHJ material is deposited onto the top surface of metal layer 326. The BHJ material can be applied by screen printing, slot-die coating, spin-coating, spray coating or by inkjet printing. The solution coats or fills, depending on the thickness deposited, each pixel well. Typical thicknesses range from 100 nm to 1000 nm. The BHJ layer 338 is then baked initially for 2 to 8 minutes between 50° C. to 80° C. to drive the solvent out slowly. Afterwards, the BHJ layer 338 is baked in a nitrogen environment or in a vacuum between 110° C. and 130° C. for 3 to 10 minutes, in an embodiment.

Figure 22:
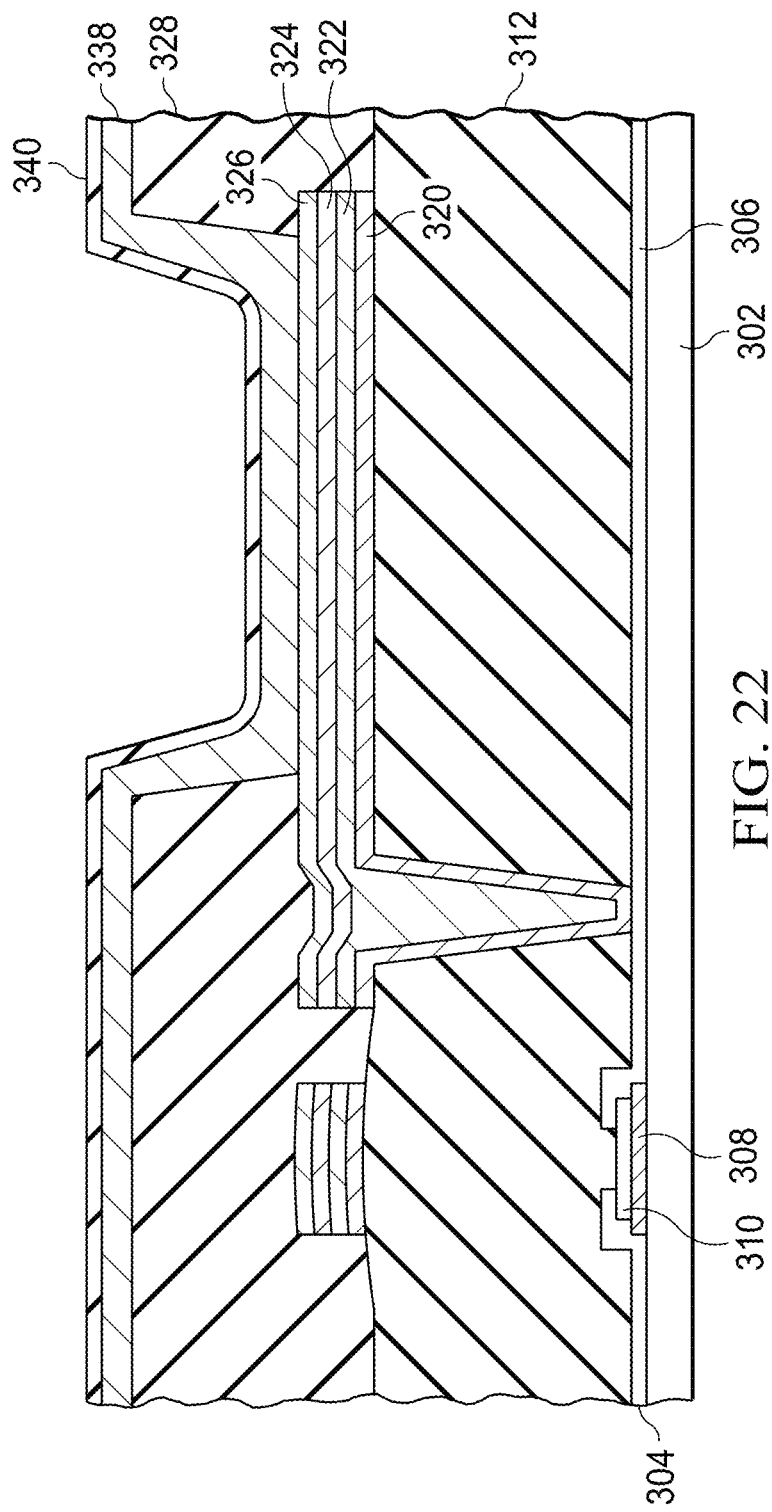

FIG. 22 shows the deposition of the Hole Transport Layer ("HTL") 340. The HTL layer 34o has the function of tuning, or bridging the work function of the BHJ with the work function of the anode layer, or top contact layer material and is ideally poly(3,4-ethylenedioxythiophene) polystyrene sulfonate ("PEDOT:PSS") and is deposited directly onto the BHJ layer 338. The HTL material can be applied by spin-coating, spray-coating or an inkjet process. The solution coats or fills, depending on the thickness deposited, each pixel well. Typical thicknesses range from 5 nm to 400 nm. The HTL layer 340 is then baked on a hot plate in a nitrogen environment for 5 to 20 minutes between 100° C. to 130° C. Alternate materials for the HTL layer can be molybdenum trioxide ($MoO_3$). $MoO_3$ is deposited by an evaporation process, in an embodiment.

Figure 23:
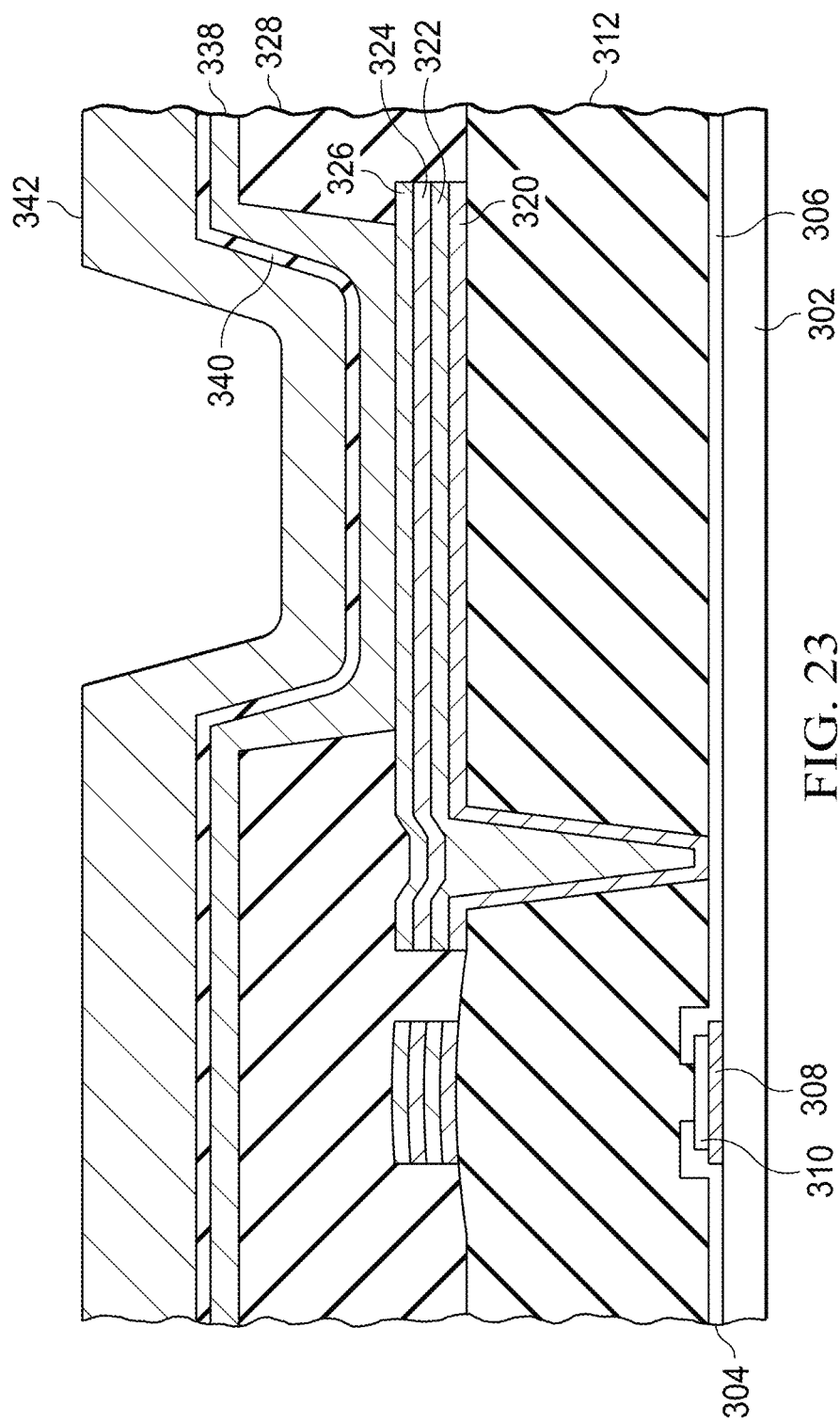
Figure 24:
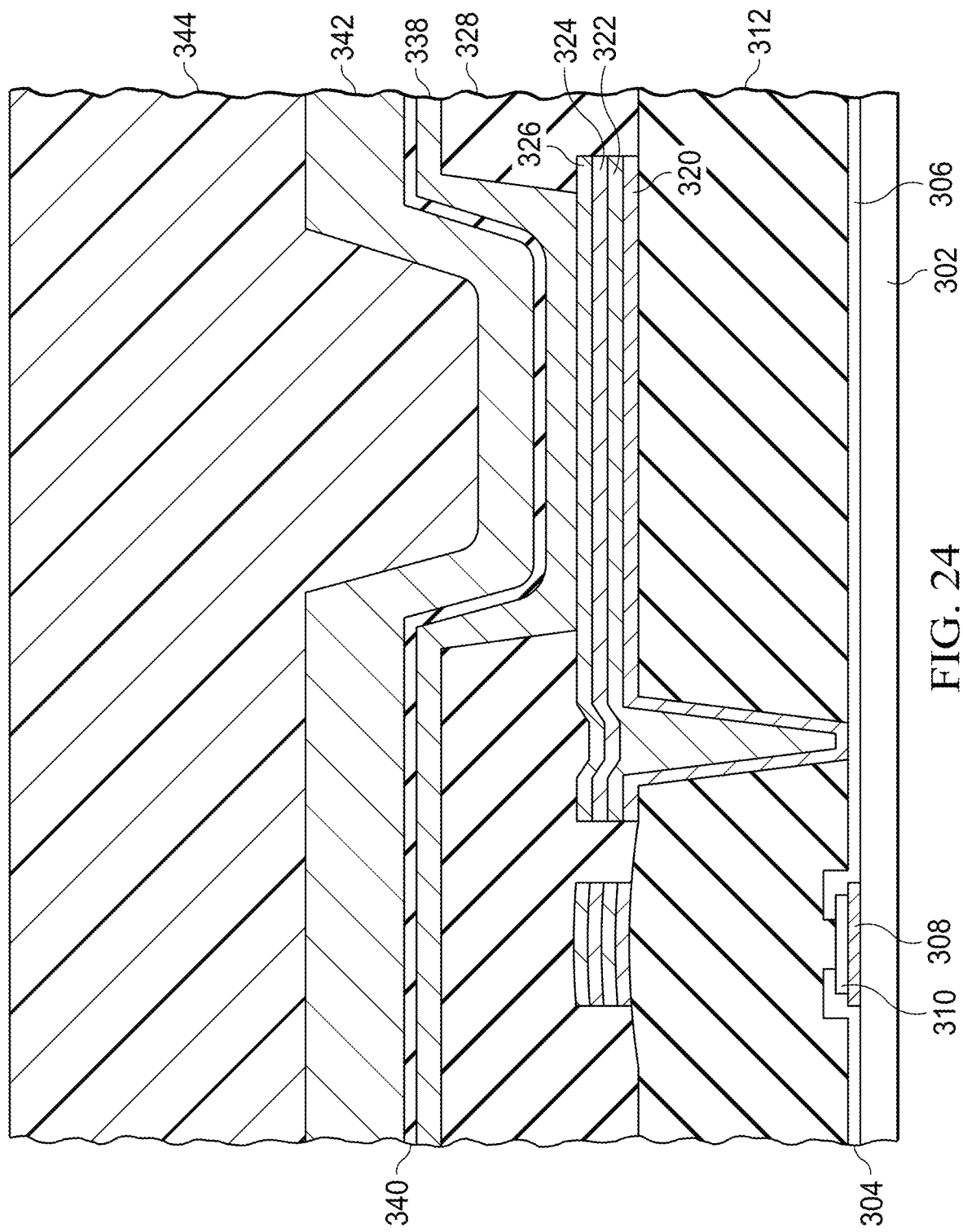

FIG. 23 shows the deposition of the Top Contact Layer ("TC") 342. The TC layer 342 has the function of acting as the top contact, or anode of the photodiode and can be either a transparent conductive material, such as different mixtures of PEDOT:PSS or silver nanowire and deposited directly onto the HTL layer 340. The TC material can be applied by screen printing, slot-die coating, spin-coating, spray coating or by an inkjet process. The solution coats or fills, depending on the thickness deposited, each pixel well. Typical thicknesses range from 100 nm to 1000 nm. The TC layer 342 is then baked initially for 2 to 8 minutes between 50° C. to 80° C. to drive the solvent out slowly. Afterwards, the TC layer 342 is baked in a nitrogen environment or in a vacuum between 110° C. and 130° C. for 3 to 10 minutes.

Further, with respect to FIG. 23, a grid bias it applied to the top contact TC layer 342 for proper electrical operation of the array. Layers 338 to 342 are not further patterned to create the individual pixels, as electrons impinging outside of the pixel wells are just absorbed and do not contribute to the individual pixel signals.

A clear material that is compatible with layers 338 to 342 can be used as a moisture barrier 344 (and a passivation layer). The moisture barrier layer 344 comprises an optically clear adhesive such as 3M 8171 or 3M 8172 and a laminated transparent barrier film such as 3M FTB3-50 and is edge sealed with a moisture resistant epoxy such as MasterBond EP39-2, or Addison CW A1853-TX, in embodiments.

Figure 25:
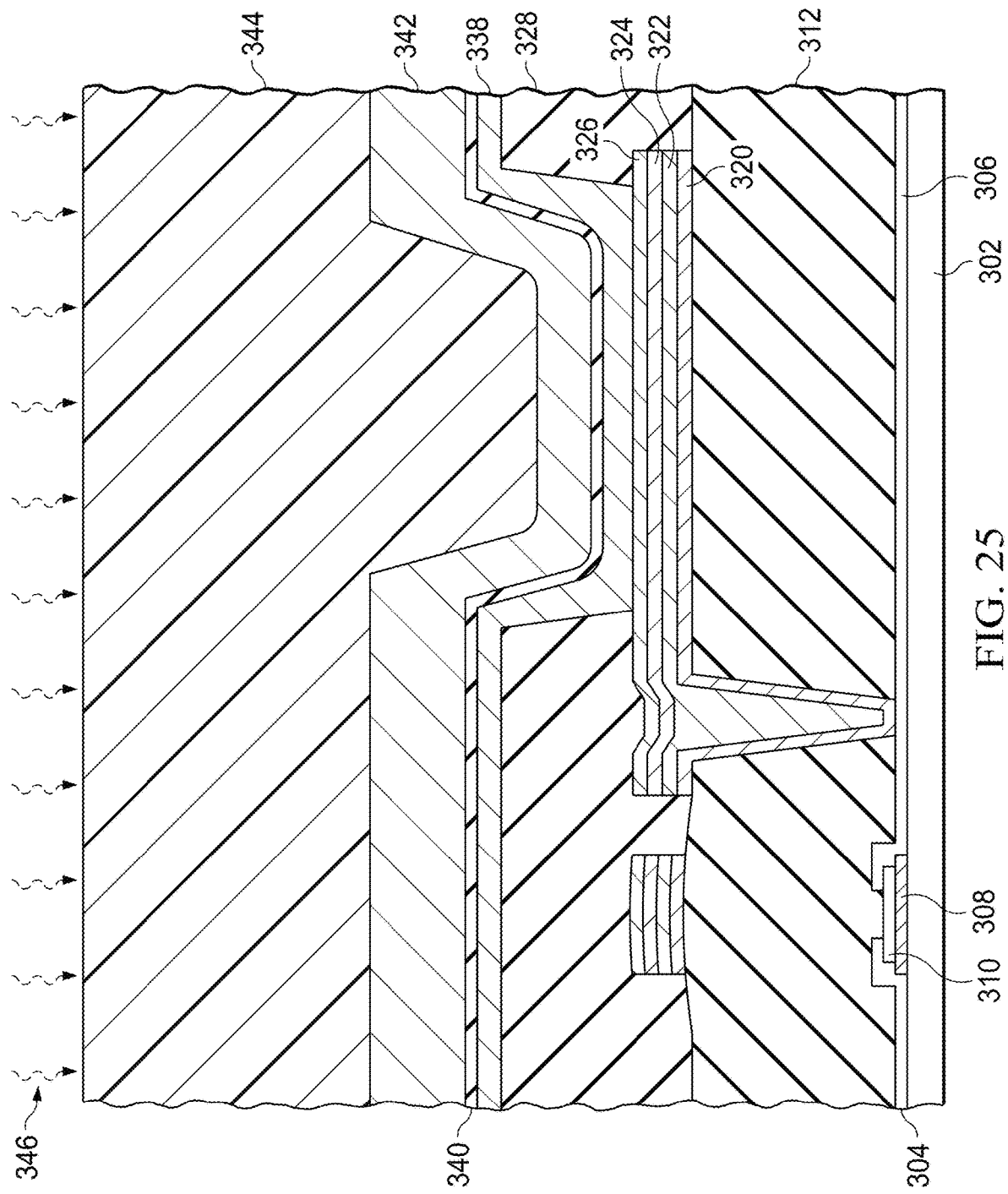

The completed architecture of an OPD photosensor pixel cell is shown in FIG. 25, which is now ready to convert the incoming light or radiation 346 into a data signal at line 304. The data signal at line 304 can be further processed and converted to a digital signal having appropriate logic levels that can be used by other external processing circuitry not shown in FIG. 25.

Figure 26:
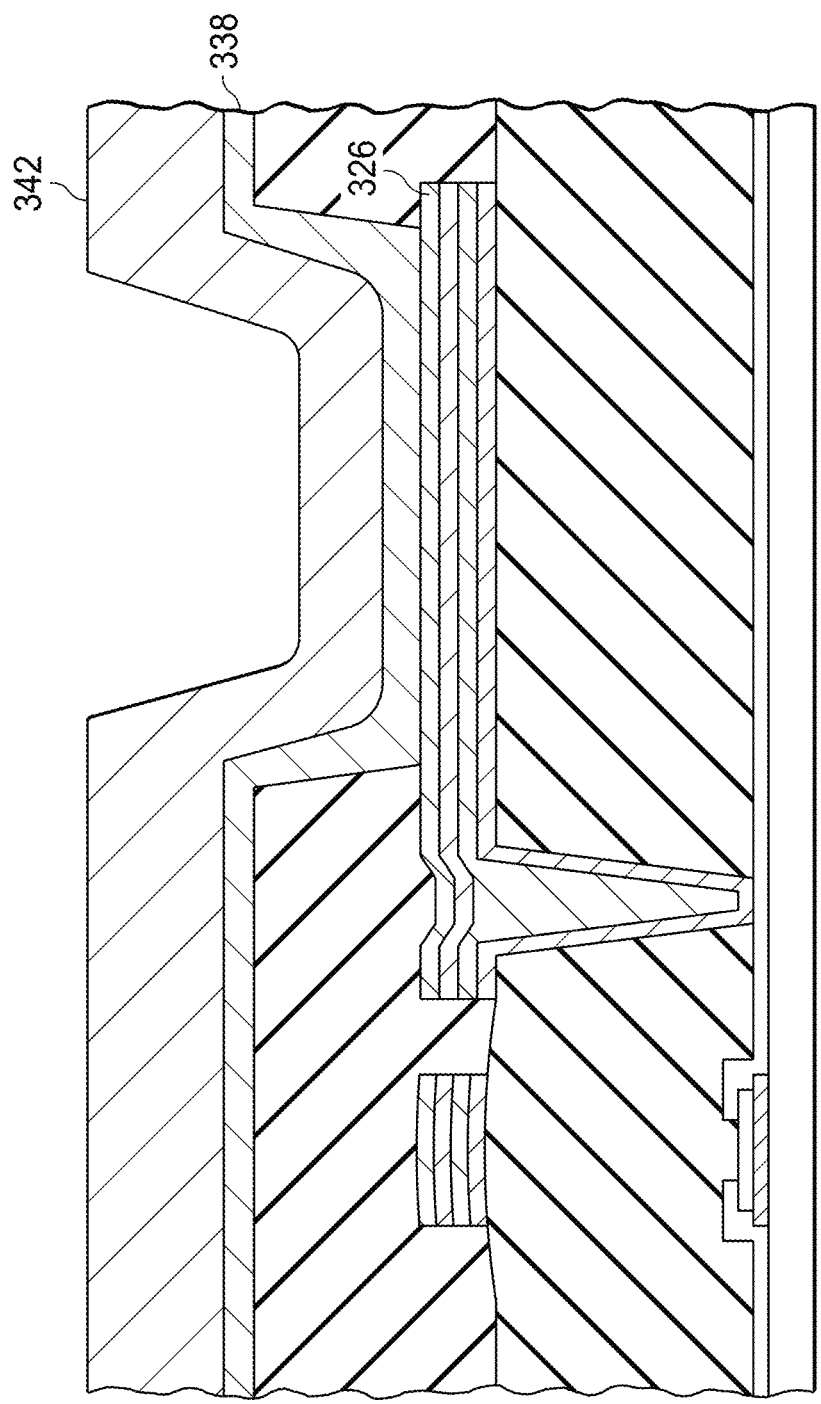
FIGS. 26-28 are alternative cross-sectional view of the final manufacturing steps shown in FIGS. 9-25 wherein the hole transport layer is eliminated.
Figure 27:
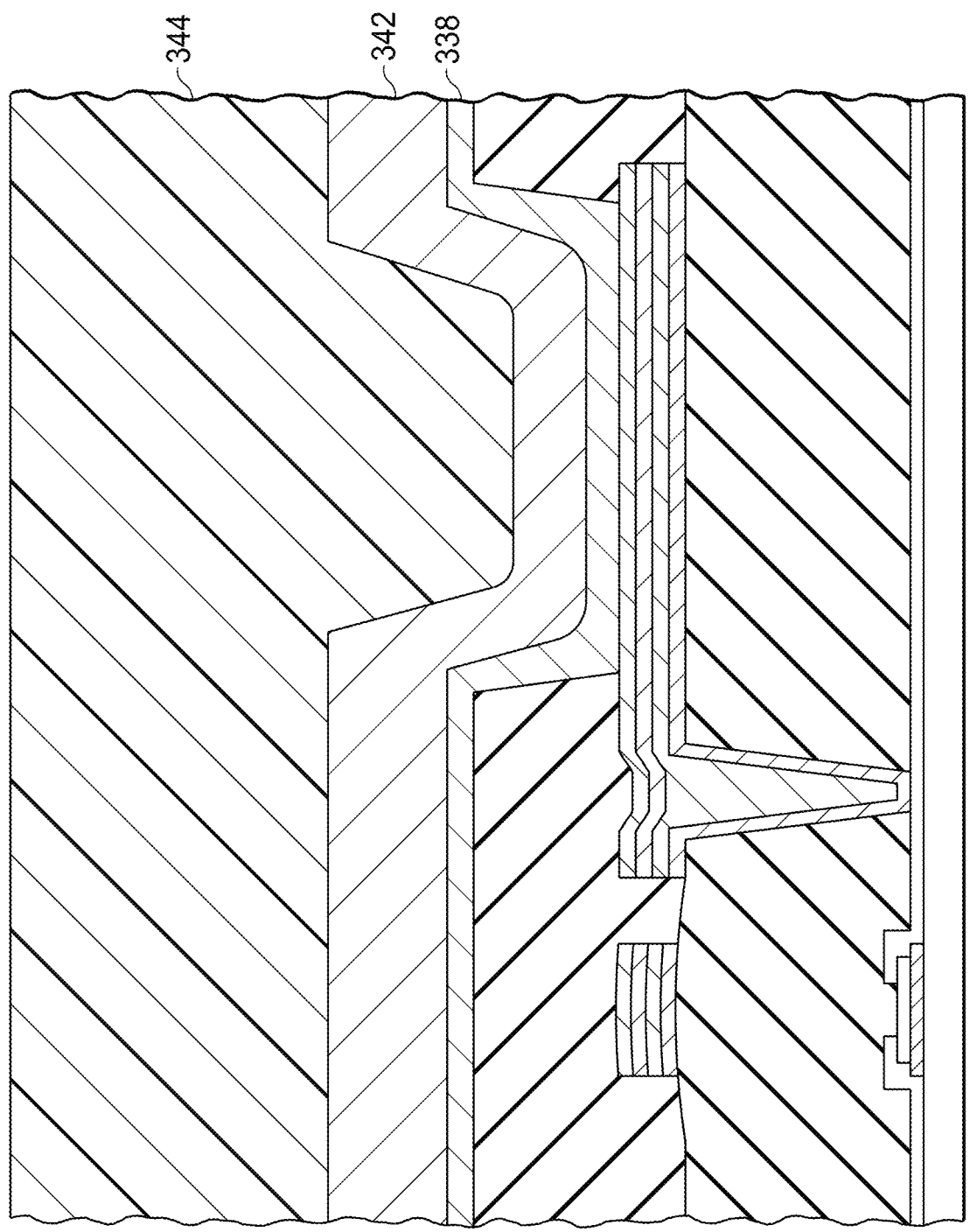
Figure 28:
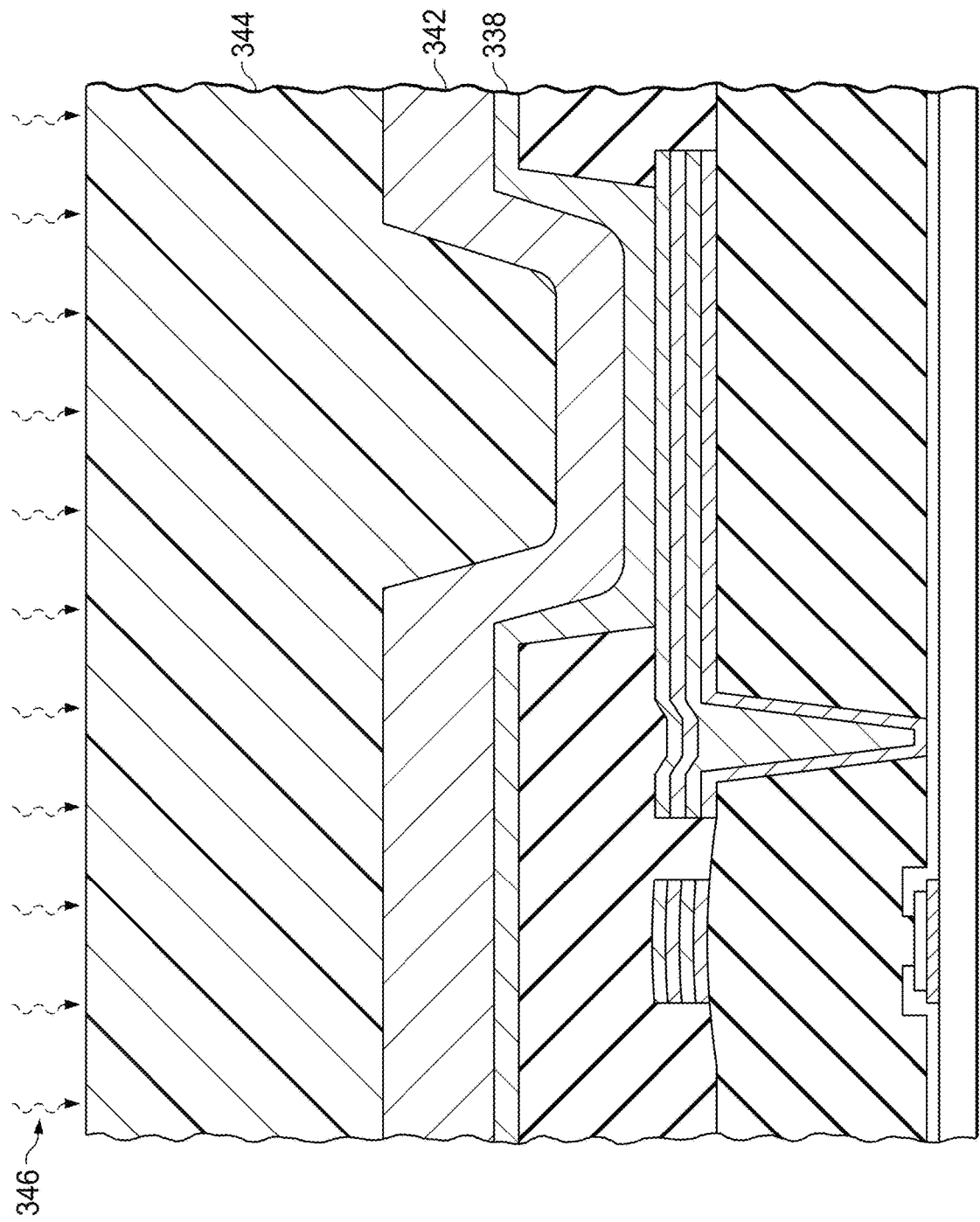

An alternative architecture for an OPD photosensor pixel cell omits the hole transport layer as is shown in the cross-sectional views of FIGS. 26-28, according to an embodiment.

FIG. 26 includes all of the layers previously shown in, for example, FIG. 23. Certain identification numerals are omitted for clarity. In pertinent part, FIG. 26 shows at the BHJ is directly coupled to top metal layer 326, and the TC layer 342 is directly coupled to the BHJ layer 338, in an embodiment.

FIG. 27 shows the addition of the moisture barrier 344, previously discussed, to the top surface of the TC layer 342.

FIG. 28 shows the completed alternative architecture of an OPD photosensor pixel cell without the inclusion of the hole transport layer, which is now ready to convert the incoming light or radiation 346 into a data signal at line 304.

FIG. 29 is a table that shows the materials, nominal thickness, and manufacturing technique used in forming the various layers shown in the cross-sectional drawings of FIGS. 9-28, including gate 308, gate dielectric 310, source and drain lines 304 and 306, ILD layer 312, metal stack layers 320, 322, 324, and 326, and bank layer 328.

FIG. 30 is a schematic diagram as well as a cross-sectional view of an OPD sensor array wherein the photodiode is negatively biased, according to an embodiment. The schematic diagram shows only a single pixel in the array, but those skilled in the art will appreciate that a plurality of pixels arranged in rows and columns will typically be included in the array. The pixel includes a TFT switch 408 having a gate coupled to a gate line 404, a source/drain coupled to a data line 406, a source/drain coupled to the cathode of an organic photodiode 410A. The anode of organic photodiode 410 is coupled to a bias line 402, which is negatively biased to, for example, −3.8 volts. The corresponding cross-sectional diagram shown in FIG. 30 includes the OPD layers in order as the BHJ layer 338, the HTL layer 340, the TC layer 342, and the MB layer 344.

FIG. 31 is a schematic diagram as well as a cross-sectional view of an OPD sensor array wherein the photodiode is positively biased, according to an embodiment. The schematic diagram shows only a single pixel in the array, but those skilled in the art will appreciate that a plurality of pixels arranged in rows and columns will typically be included in the array. The pixel includes a TFT switch 408 having a gate coupled to a gate line 404, a source/drain coupled to a data line 406, a source/drain coupled to the anode of an organic photodiode 410B. The cathode of organic photodiode 410 is coupled to a bias line 402, which is positively biased to, for example, 3.8 volts. The corresponding cross-sectional diagram shown in FIG. 31 includes the OPD layers in order as the HTL layer 340, the BHJ layer 338, the TC layer 342, and the MB layer 344.

Both architectures shown in FIG. 30 and FIG. 31 can be used for photosensor arrays depending upon the manner in which the electronic circuitry used to gather the light collected by the photosensor array is configured.

Figure 32:
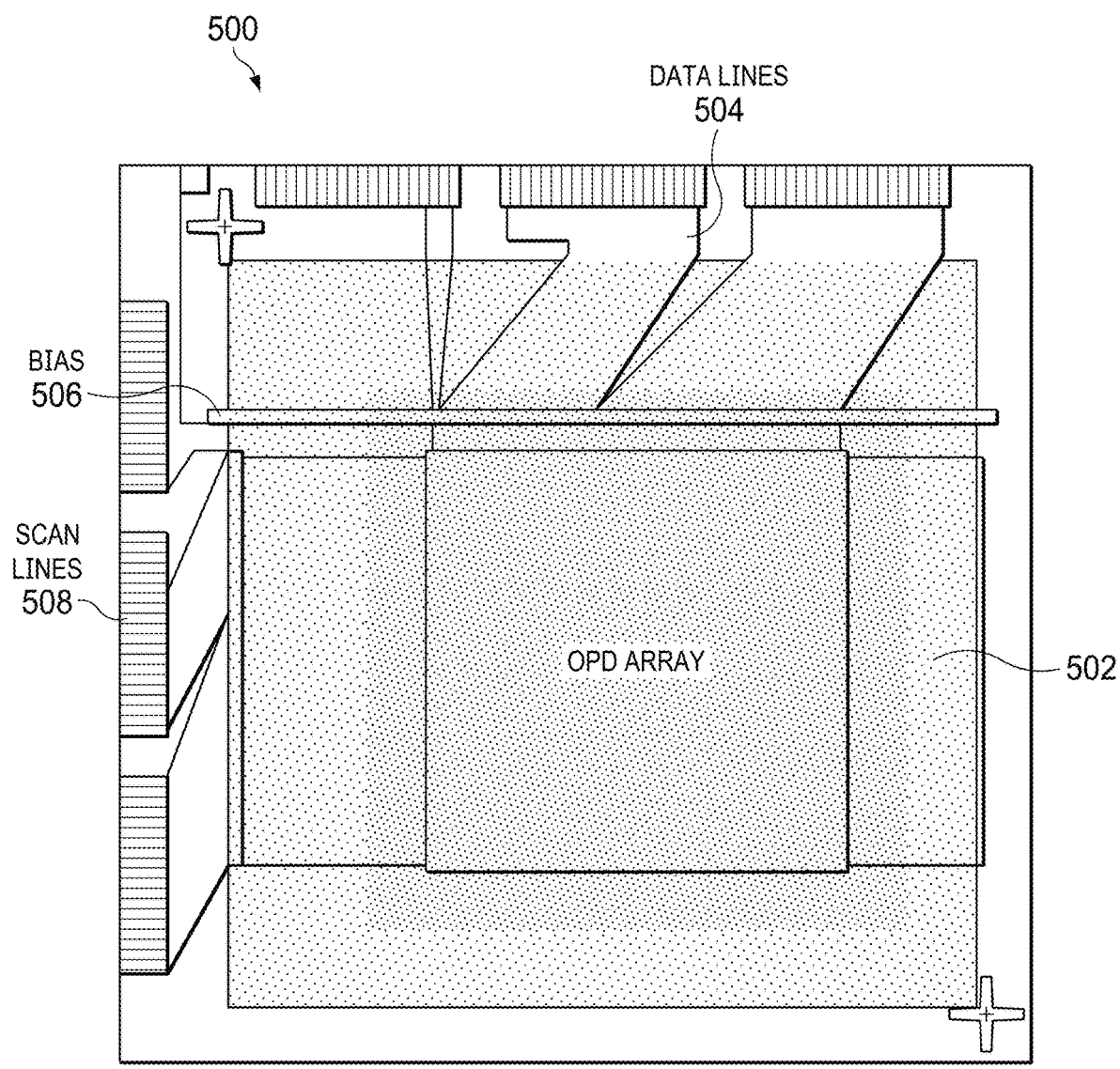
FIG. 32 is a plan view of an OPD array, including associated data lines bias lines, scan lines.

FIG. 32 is a plan view of an OPD array product 500, including an OPD array 502 of OPD pixels, associated data lines 504, bias line 506, and scan lines 508, in an embodiment.

Figure 33:
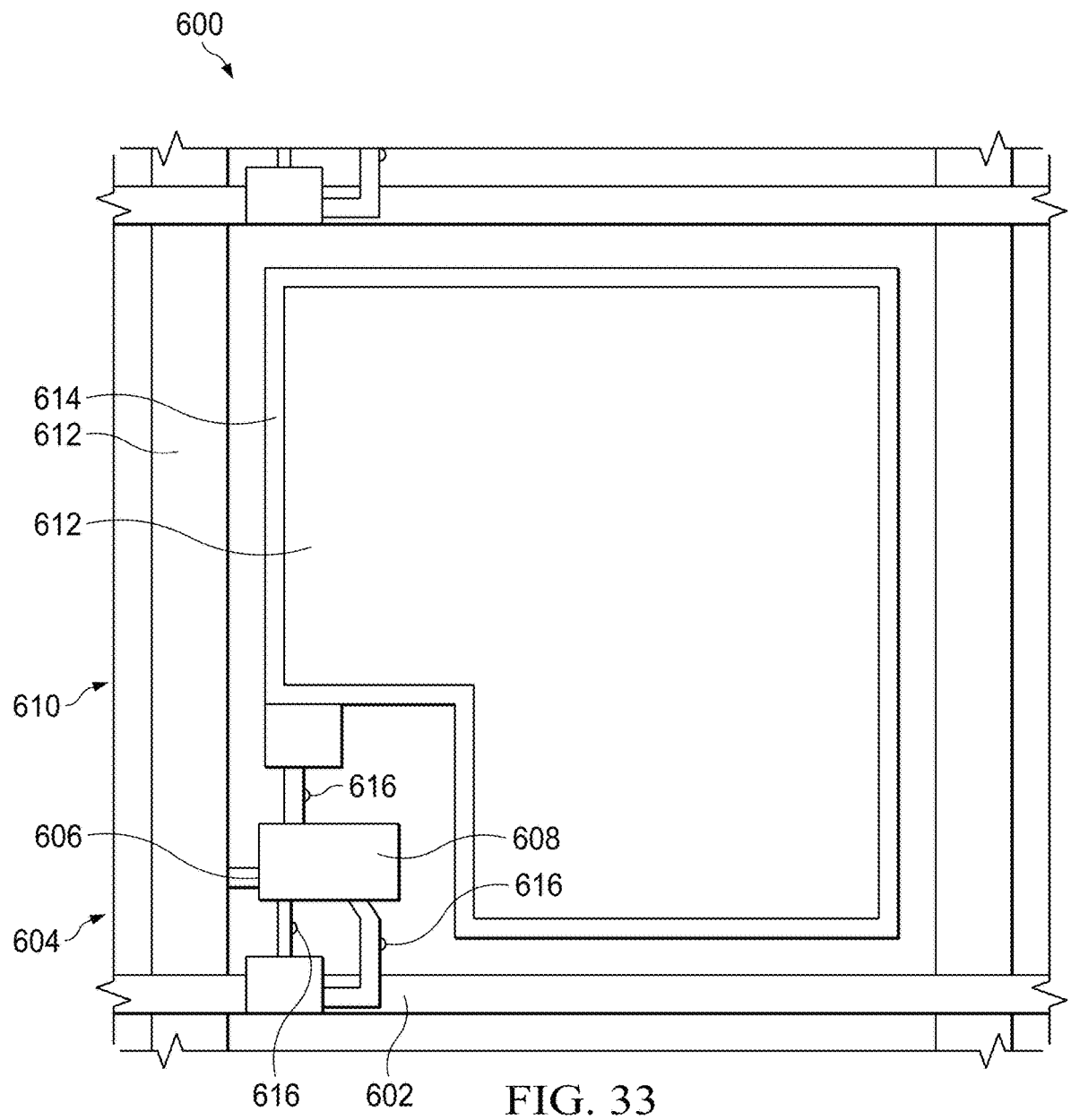
FIG. 33 is a plan view of an active matrix OPD pixel layout.

FIG. 33 is a plan view of an active matrix OPD pixel layout 600, including the gate layer M1 602, the gate dielectric (blanket film) layer M2 604, the channel and island layer M2 606, the source drain layer M3 608, the ILD (blanket film) layer M4 610, the diode contact and data metal layer M5 612, and the bank layer M6 614, in an embodiment.

Figure 34:
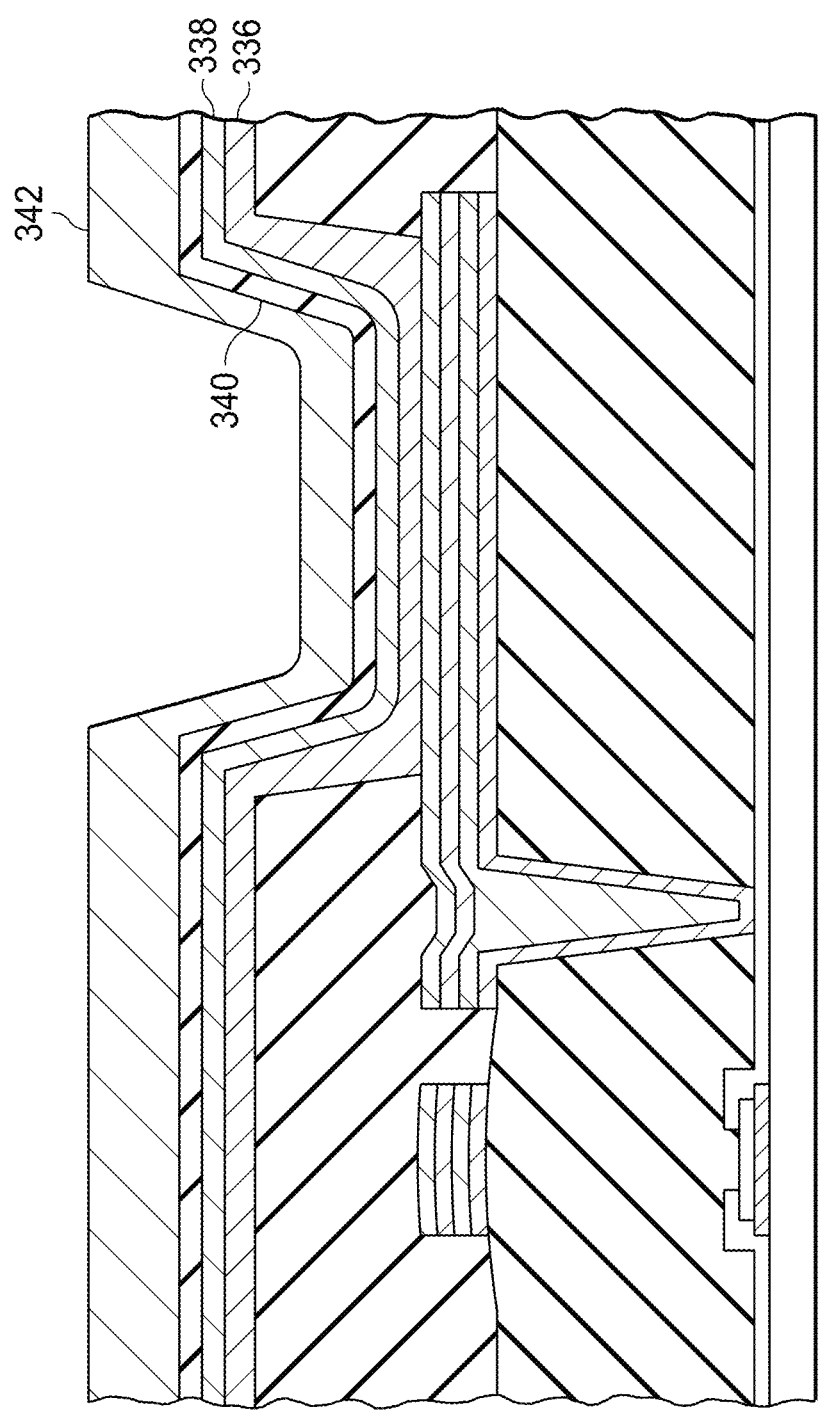
FIG. 34 is a cross-sectional view of an active matrix OPD sensor pixel according to the prior art.

FIG. 34 is a cross-sectional view of an active matrix OPD sensor pixel according to the prior art, including ETL layer 336, BHJ layer 338, HTL layer 340, and TC layer 342.

Figure 35:
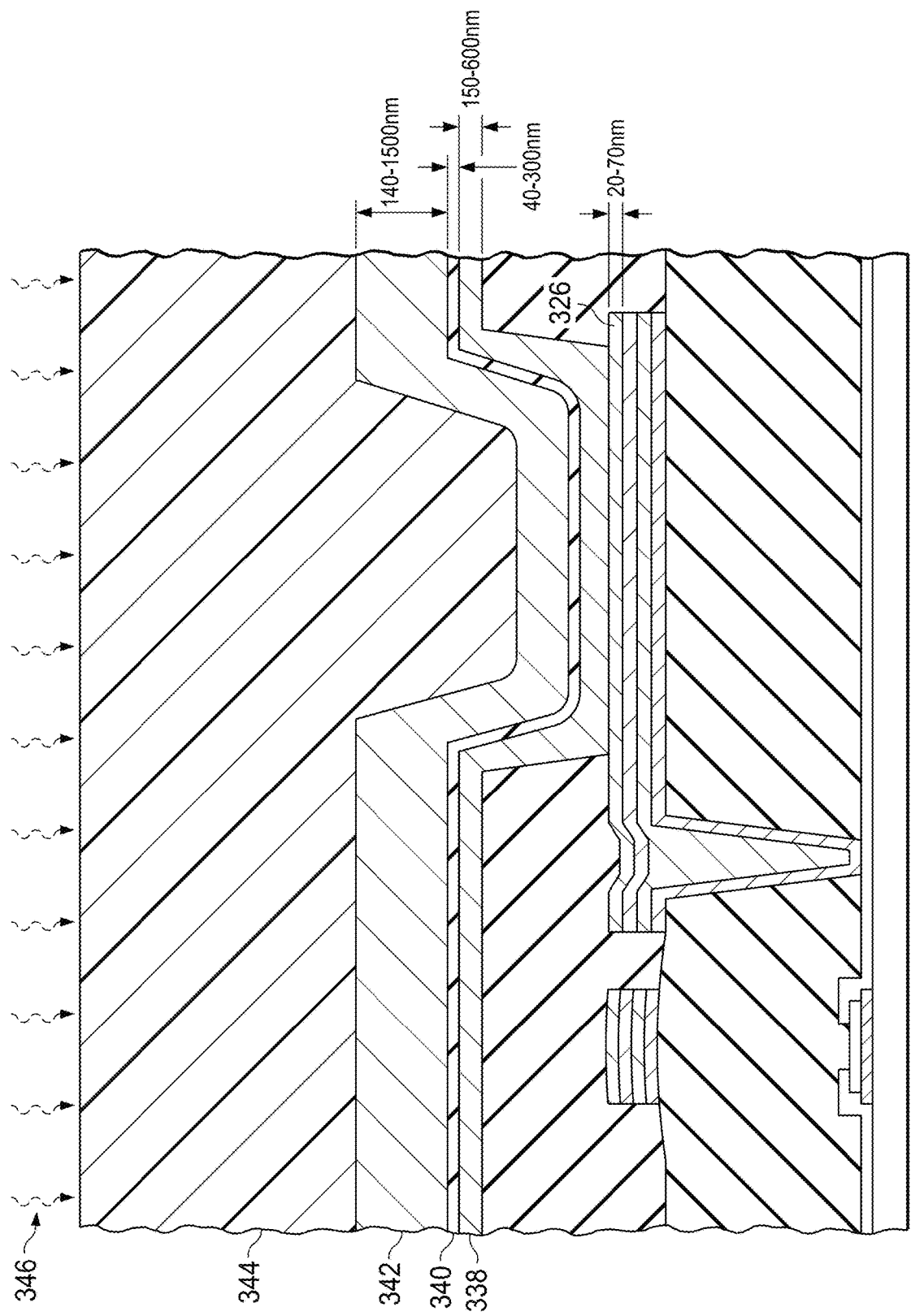
FIG. 35 is a cross-sectional view of an active matrix OPD sensor pixel comprising a three-layer architecture according to an embodiment.

FIG. 35 is a cross-sectional view of an active matrix OPD sensor pixel comprising a three-layer architecture according to an embodiment, including BHJ layer 328 directly coupled to metal layer 326, HTL layer 340 directly coupled to BHJ layer 338, and TC layer directly coupled to HTL layer 340. Moisture barrier 344 is also shown coupled to TC layer 342.

Figure 36:
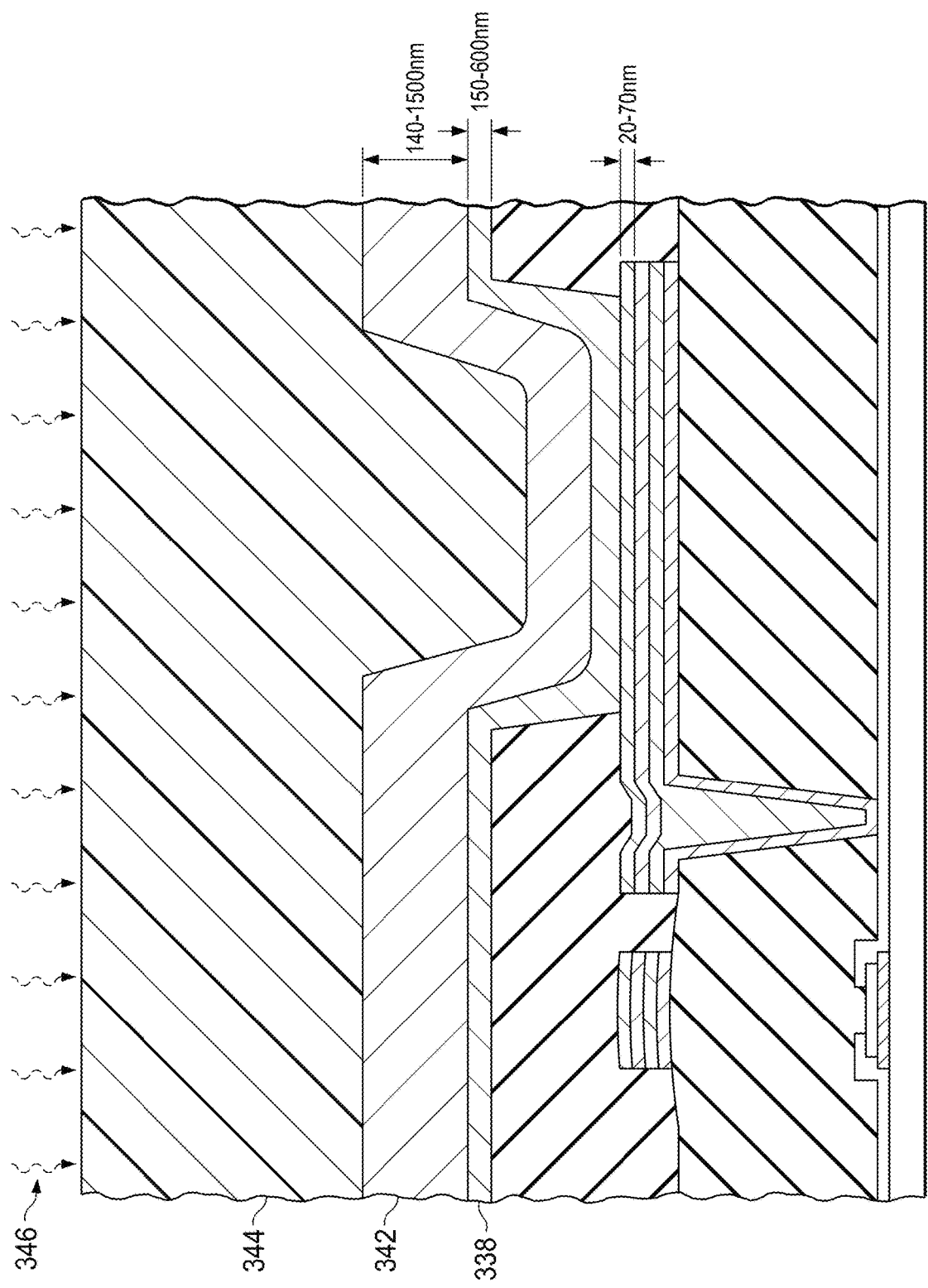
FIG. 36 is a cross-sectional view of an active matrix OPD sensor pixel comprising a two-layer architecture according to an embodiment.

FIG. 36 is a cross-sectional view of an active matrix OPD sensor pixel comprising a two-layer architecture according to another embodiment, including BHJ layer 338 directly coupled to metal layer 326, and TC layer 342 directly coupled to BHJ layer 338. Moisture barrier 344 is also shown coupled to TC layer 342.

Embodiment methods for manufacturing the image sensor device, and the image sensor device itself, according to embodiments, can include one or more of the following:

An active matrix thin film transistor element comprising a metal oxide TFT;

Embodiment mixed metal oxides for the TFT having the formula $A_xB_xC_xO_x$ including but not limited to aluminum-indium-zinc-oxide, hafnium-indium-zinc oxide, indium-gallium-zinc oxide, cadmium-gallium-indium oxide, zinc-cadmium-gallium oxide, and zinc-cadmium-indium oxide;

An active matrix thin film transistor element comprising a low temperature polysilicon (LTPS) TFT;

An organic photodiode hole transport layer comprising a printed transparent organic conductor;

An active matrix thin film transistor element comprising an organic semiconductor TFT;

An organic photodiode top contact (anode) comprising silver nanowires;

An organic photodiode top contact (anode) comprising an evaporated silver (Ag) metal;

An organic photodiode top contact (anode) comprising a printed transparent organic conductor (for example Agfa Orgacon EL-P3145);

An organic photodiode top contact (anode) utilizing a printable transparent silver conductor (for example LOCTITE ECI 5003 E&C);

An organic photodiode comprising a patterned via in an interlayer dielectric material;

An organic photodiode wherein the polarity of the diode operation is reversed by changing order of materials in the OPD—i.e. the HTL layer and the BHJ layer;

An organic photosensor element comprising a bulk heterojunction layer, a hole transport layer, and a top contact layer or a bulk heterojunction layer and a top contact layer;

A data metal/diode stacked contact electrode comprising TiW-A-TiW, Mo—Al—Mo or Ti—Al—Ti;

A data metal/diode stacked contact electrode comprising an ITO, IGZO, or AIZO top layer;

A photosensor device wherein the substrate is plastic (for example polyethylene naphthalate, polyethylene terephthalate, or polyimide);

A photosensor device wherein any of the active organic semiconductor materials are vacuum filtered prior to coating;

A photosensor device wherein any of the active organic semiconductor materials are processed via any combination of slot die coating, screen printing, ink jet printing or spray coating;

An ILD (M4) layer comprising an organic dielectric or hybrid dielectric structure; and/or A method wherein the organic photosensing material can be applied on the substrate first with a bias electrode, and then the subsequent processing can be applied on top of the sensor material to form array of thin film transistors for a read out operation.

Advantages of the image sensor device of the present invention include increased performance with respect to prior art image sensor devices, wherein the design and fabrication described herein increases the sensitivity of the image sensor device because of the reduction of layers. The reduction of layers advantageously allows more light to reach the photodiode array. In additional lower manufacturing costs are realized compared to the manufacturing costs of the traditional OPD architecture and PECVD PIN diode. It is a further advantage that the image sensor lends itself to very large area scalability; up to greater than one meter×one meter substrate size can be achieved. It is a further advantage that the image sensor has increased manufacturability/yield since, according to embodiments, the design described herein allows for device laser repair, the design incorporates a global bias grid connection to mitigate the voltage drop across the device, and the design mitigates shorting defects between gate and data metal layers.

Applications for the image sensor described herein include X-ray sensors for medical, industrial and homeland security, IR sensors, motion sensors, and other photonics sensors. Possible applications could also include very large area printed sensors arrays. Other applications not necessarily related to medical X-ray applications are possible as well.

While this invention has been described with reference to illustrative embodiments, this description is not intended to be interpreted in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An image sensor comprising:
    a substrate;
    a thin film transistor on the substrate;
    a dielectric layer over the thin film transistor;
    a stacked metal layer on and extending through the dielectric layer to the thin film transistor;
    a bulk heterojunction layer directly contacting a top layer of the stacked metal layer, wherein the bulk heterojunction layer comprises a single material layer and directly contacts the top layer of the stacked metal layer without an intervening electron transport layer;
    a hole transport layer directly contacting the bulk heterojunction layer; and
    a top contact layer directly contacting the hole transport layer.

2. The image sensor of claim 1, wherein the bulk heterojunction layer comprises an electron donor/acceptor material.

3. The image sensor of claim 1, wherein the hole transport layer comprises a transparent conductive polymer material.

4. The image sensor of claim 1, wherein the top contact layer comprises a transparent conductive material.

5. The image sensor of claim 1, further comprising a moisture barrier layer directly coupled to the top contact layer.

6. The image sensor of claim 5, wherein the moisture barrier layer comprises an optically clear adhesive and a laminated transparent barrier film.

7. The image sensor of claim 1, wherein the bulk heterojunction layer and the hole transport layer comprise a photodiode having an anode coupled to a bias line of the image sensor.

8. An image sensor comprising:
    a substrate;
    a thin film transistor on the substrate;
    a dielectric layer over the thin film transistor;
    a stacked metal layer on and extending through the dielectric layer to the thin film transistor;
    a hole transport layer directly contacting a top layer of the stacked metal layer;
    a bulk heterojunction layer directly contacting the hole transport layer; and
    a top contact layer directly contacting the bulk heterojunction layer.

9. The image sensor of claim 8, wherein the hole transport layer comprises a conductive polymer material.

10. The image sensor of claim 8, wherein the bulk heterojunction layer comprises an electron donor/acceptor material.

11. The image sensor of claim 8, wherein the top contact layer comprises a transparent conductive material.

12. The image sensor of claim 8, further comprising a moisture barrier layer directly coupled to the top contact layer.

13. The image sensor of claim 12, wherein the moisture barrier layer comprises an optically clear adhesive and a laminated transparent barrier film.

14. The image sensor of claim 8, wherein the bulk heterojunction layer and the hole transport layer comprise a photodiode having a cathode coupled to a bias line of the image sensor.

15. An image sensor comprising:
    a substrate;
    a thin film transistor on the substrate;
    a dielectric layer over the thin film transistor;
    a stacked metal layer on and extending through the dielectric layer to the thin film transistor;
    a bulk heterojunction layer directly contacting a top layer of the stacked metal layer, wherein the bulk heterojunction layer comprises a single material layer and directly contacts the top layer of the stacked metal layer without an intervening electron transport layer;
    and a top contact layer directly contacting the bulk heterojunction layer.

16. The image sensor of claim 15, wherein the bulk heterojunction layer comprises an electron donor/acceptor material.

17. The image sensor of claim 15, wherein the top contact layer comprises a transparent conductive material.

18. The image sensor of claim 15, further comprising a moisture barrier layer directly coupled to the top contact layer.

19. The image sensor of claim 18, wherein the moisture barrier layer comprises an optically clear adhesive and a laminated transparent barrier film.

20. The image sensor of claim 15, wherein the bulk heterojunction layer comprises a photodiode coupled to a bias line of the image sensor.

* * * * *

UNITED STATES PATENT AND TRADEMARK OFFICE
CERTIFICATE OF CORRECTION

PATENT NO. : 10,872,928 B2  
APPLICATION NO. : 16/549392  
DATED : December 22, 2020  
INVENTOR(S) : Robert Rodriquez et al.

It is certified that error appears in the above-identified patent and that said Letters Patent is hereby corrected as shown below:

On the Title Page

Item (54), Line 1, delete "METHOD" and insert --DESIGN AND METHOD--.

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*